(12) United States Patent
Maleki et al.

(10) Patent No.: US 8,417,076 B2
(45) Date of Patent: Apr. 9, 2013

(54) TUNABLE PHOTONIC MICROWAVE OR RADIO FREQUENCY RECEIVERS BASED ON ELECTRO-OPTIC OPTICAL WHISPERING GALLERY MODE RESONATORS

(75) Inventors: Lute Maleki, Pasadena, CA (US); David Seidel, Alta Loma, CA (US); Wei Liang, Pasadena, CA (US); Anatoliy A. Savchenkov, Glendale, CA (US); Andrey B. Matsko, Pasadena, CA (US); Vladimir S. Ilchenko, Arcadia, CA (US); Prakash Koonath, La Crescenta, CA (US)

(73) Assignee: OEwaves, Inc., Pasadena, CA (US)

( * ) Notice: Subject to any disclaimer, the term of this patent is extended or adjusted under 35 U.S.C. 154(b) by 217 days.

(21) Appl. No.: 12/821,132

(22) Filed: Jun. 22, 2010

(65) Prior Publication Data

US 2012/0194893 A1  Aug. 2, 2012

Related U.S. Application Data

(60) Provisional application No. 61/219,187, filed on Jun. 22, 2009, provisional application No. 61/235,932, filed on Aug. 21, 2009.

(51) Int. Cl.
  *G02B 6/26* (2006.01)
(52) U.S. Cl. ............... 385/30; 385/2; 359/245; 359/239
(58) Field of Classification Search .............. 385/2, 30, 385/36, 39, 40, 42, 146; 372/6, 18, 92, 94, 372/98, 104, 108; 359/239, 245
See application file for complete search history.

(56) References Cited

U.S. PATENT DOCUMENTS

| | | | |
|---|---|---|---|
| 5,204,640 A | 4/1993 | Logan, Jr. | |
| 5,220,292 A | 6/1993 | Bianchini et al. | |
| 5,723,856 A | 3/1998 | Yao et al. | |
| 5,751,747 A | 5/1998 | Lutes et al. | |
| 5,777,778 A | 7/1998 | Yao | |
| 5,917,179 A | 6/1999 | Yao | |
| 5,929,430 A | 7/1999 | Yao et al. | |
| 5,985,166 A | 11/1999 | Unger et al. | |
| 6,080,586 A | 6/2000 | Baldeschwieler et al. | |
| 6,178,036 B1 | 1/2001 | Yao | |
| 6,203,660 B1 | 3/2001 | Unger et al. | |
| 6,389,197 B1 | 5/2002 | Iltchenko et al. | |

(Continued)

FOREIGN PATENT DOCUMENTS

WO    WO-01/96936 A1    12/2001
WO    WO-2005/038513 A2    4/2005

(Continued)

OTHER PUBLICATIONS

Braginsky, V.B., et al., "Quality-Factor and Nonlinear Properties of Optical Whispering-Gallery Modes," *Physics Letters A*, 137(7, 8):393-397, May 1989.

(Continued)

*Primary Examiner* — Ellen Kim
(74) *Attorney, Agent, or Firm* — Perkins Coie LLP

(57) ABSTRACT

Photonic devices and techniques based on tunable single sideband (SSB) modulation in whispering gallery mode resonators formed of electro-optic materials to construct RF or microwave receivers.

22 Claims, 22 Drawing Sheets

U.S. PATENT DOCUMENTS

| | | |
|---|---|---|
| 6,417,957 B1 | 7/2002 | Yao |
| 6,473,218 B1 | 10/2002 | Maleki et al. |
| 6,476,959 B2 | 11/2002 | Yao |
| 6,487,233 B2 | 11/2002 | Maleki et al. |
| 6,488,861 B2 | 12/2002 | Iltchenko et al. |
| 6,490,039 B2 | 12/2002 | Maleki et al. |
| 6,535,328 B2 | 3/2003 | Yao |
| 6,567,436 B1 | 5/2003 | Yao et al. |
| 6,580,532 B1 | 6/2003 | Yao et al. |
| 6,594,061 B2 | 7/2003 | Huang et al. |
| 6,762,869 B2 | 7/2004 | Maleki et al. |
| 6,795,481 B2 | 9/2004 | Maleki et al. |
| 6,798,947 B2 | 9/2004 | Iltchenko |
| 6,853,479 B1 | 2/2005 | Ilchenko et al. |
| 6,871,025 B2 | 3/2005 | Maleki et al. |
| 6,873,631 B2 | 3/2005 | Yao et al. |
| 6,879,752 B1 | 4/2005 | Ilchenko et al. |
| 6,901,189 B1 | 5/2005 | Savchenkov et al. |
| 6,906,309 B2 | 6/2005 | Sayyah et al. |
| 6,922,497 B1 | 7/2005 | Savchenkov et al. |
| 6,928,091 B1 | 8/2005 | Maleki et al. |
| 6,943,934 B1 | 9/2005 | Ilchenko et al. |
| 6,987,914 B2 | 1/2006 | Savchenkov et al. |
| 7,024,069 B2 | 4/2006 | Savchenkov et al. |
| 7,043,117 B2 | 5/2006 | Matsko et al. |
| 7,050,212 B2 * | 5/2006 | Matsko et al. .............. 359/245 |
| 7,061,335 B2 | 6/2006 | Maleki et al. |
| 7,062,131 B2 | 6/2006 | Ilchenko |
| 7,092,591 B2 | 8/2006 | Savchenkov et al. |
| 7,133,180 B2 | 11/2006 | Ilchenko et al. |
| 7,173,749 B2 | 2/2007 | Maleki et al. |
| 7,184,451 B2 | 2/2007 | Ilchenko et al. |
| 7,187,870 B2 | 3/2007 | Ilchenko et al. |
| 7,218,662 B1 | 5/2007 | Ilchenko et al. |
| 7,248,763 B1 | 7/2007 | Kossakovski et al. |
| 7,260,279 B2 | 8/2007 | Gunn et al. |
| 7,283,707 B1 | 10/2007 | Maleki et al. |
| 7,356,214 B2 | 4/2008 | Ilchenko |
| 7,362,927 B1 | 4/2008 | Ilchenko et al. |
| 7,369,722 B2 | 5/2008 | Yilmaz et al. |
| 7,389,053 B1 | 6/2008 | Ilchenko et al. |
| 7,400,796 B1 | 7/2008 | Kossakovski et al. |
| 7,440,651 B1 | 10/2008 | Savchenkov et al. |
| 7,460,746 B2 | 12/2008 | Maleki et al. |
| 7,480,425 B2 | 1/2009 | Gunn et al. |
| 7,587,144 B2 | 9/2009 | Ilchenko et al. |
| 7,630,417 B1 | 12/2009 | Maleki et al. |
| 7,634,201 B2 | 12/2009 | Maleki et al. |
| 7,801,189 B2 * | 9/2010 | Maleki et al. .............. 372/26 |
| 7,813,651 B2 | 10/2010 | Ilchenko et al. |
| 7,869,472 B2 | 1/2011 | Maleki et al. |
| 7,929,589 B1 | 4/2011 | Ilchenko et al. |
| 7,965,745 B2 | 6/2011 | Maleki et al. |
| 7,991,025 B2 | 8/2011 | Maleki et al. |
| 8,089,684 B1 | 1/2012 | Koonath et al. |
| 8,094,359 B1 * | 1/2012 | Matsko et al. .............. 359/239 |
| 8,102,597 B1 | 1/2012 | Maleki et al. |
| 8,111,722 B1 | 2/2012 | Maleki et al. |
| 8,155,913 B2 | 4/2012 | Eliyahu et al. |
| 8,155,914 B2 | 4/2012 | Eliyahu et al. |
| 8,159,736 B2 * | 4/2012 | Maleki et al. .............. 359/239 |
| 2001/0038651 A1 | 11/2001 | Maleki et al. |
| 2002/0018611 A1 | 2/2002 | Maleki et al. |
| 2002/0018617 A1 | 2/2002 | Iltchenko et al. |
| 2002/0021765 A1 | 2/2002 | Maleki et al. |
| 2002/0081055 A1 | 6/2002 | Painter et al. |
| 2002/0085266 A1 | 7/2002 | Yao |
| 2002/0097401 A1 | 7/2002 | Maleki et al. |
| 2003/0160148 A1 | 8/2003 | Yao et al. |
| 2004/0100675 A1 | 5/2004 | Matsko et al. |
| 2004/0109217 A1 | 6/2004 | Maleki et al. |
| 2004/0218880 A1 | 11/2004 | Matsko et al. |
| 2004/0240781 A1 | 12/2004 | Savchenkov et al. |
| 2005/0017816 A1 | 1/2005 | Ilchenko et al. |
| 2005/0063034 A1 | 3/2005 | Maleki et al. |
| 2005/0074200 A1 | 4/2005 | Savchenkov et al. |
| 2005/0123306 A1 | 6/2005 | Ilchenko et al. |
| 2005/0128566 A1 | 6/2005 | Savchenkov et al. |
| 2005/0175358 A1 | 8/2005 | Ilchenko et al. |
| 2005/0248823 A1 | 11/2005 | Maleki et al. |
| 2007/0009205 A1 | 1/2007 | Maleki et al. |
| 2007/0153289 A1 | 7/2007 | Yilmaz et al. |
| 2008/0001062 A1 * | 1/2008 | Gunn et al. .............. 250/206 |
| 2008/0075464 A1 | 3/2008 | Maleki et al. |
| 2008/0310463 A1 | 12/2008 | Maleki et al. |
| 2009/0097516 A1 | 4/2009 | Maleki et al. |
| 2009/0135860 A1 * | 5/2009 | Maleki et al. .............. 372/20 |
| 2009/0208205 A1 | 8/2009 | Eliyahu et al. |
| 2009/0251705 A1 * | 10/2009 | Le et al. .............. 356/480 |
| 2009/0310629 A1 | 12/2009 | Maleki et al. |
| 2009/0324251 A1 | 12/2009 | Ilchenko et al. |
| 2010/0118375 A1 * | 5/2010 | Maleki et al. .............. 359/239 |
| 2011/0110387 A1 | 5/2011 | Maleki et al. |
| 2011/0150485 A1 | 6/2011 | Seidel et al. |
| 2011/0255094 A1 | 10/2011 | Mohageg et al. |
| 2012/0039346 A1 | 2/2012 | Liang et al. |

FOREIGN PATENT DOCUMENTS

| | | |
|---|---|---|
| WO | WO-2005/055412 A2 | 6/2005 |
| WO | WO-2005/067690 A2 | 7/2005 |
| WO | WO-2005/122346 A2 | 12/2005 |
| WO | WO-2006/076585 A2 | 7/2006 |
| WO | WO-2007/143627 A2 | 12/2007 |

OTHER PUBLICATIONS

Eliyahu, D., et al., "Low Phase Noise and Spurious Levels in Multi-Loop Opto-Electronic Oscillators," *Proceedings of the 2003 IEEE International Frequency Control Sympsoium and PDA Exhibition*, pp. 405-410, May 2003.

Eliyahu, D., et al., "Modulation Response ($S_{21}$) of the Coupled Opto-Electronic Oscillator," *Proceedings of the 2005 IEEE International Frequency Control Symposium and Exposition*, pp. 850-856, Aug. 2005.

Eliyahu, D., et al., "Tunable, Ultra-Low Phase Noise YIG Based Opto-Electronic Oscillator," *IEEE MTT-S International Microwave Symposium Digest*, 3:2185-2187, Jun. 2003.

Gorodetsky, M.L., et al., "Optical Microsphere Resonators: Optimal Coupling to High-$Q$ Whispering-Gallery Modes," *J.Opt. Soc. Am. B*, 16(1):147-154, Jan. 1999.

Gorodetsky, M.L., et al., "Rayleigh Scattering in High-$Q$ Microspheres," *J. Opt. Soc. Am. B*, 17(6):1051-1057, Jun. 2000.

Gorodetsky, M.L., et al., "Ultimate $Q$ of Optical Microsphere Resonators," *Optics Letters*, 21(7):453-455, Apr. 1996.

Hryniewicz, J.V., et al., "Higher Order Filter Response in Coupled Microring Resonators," *IEEE Photonics Technology Letters*, 12(3):320-322, Mar. 2000.

Huang, S., et al., "A 'Turnkey' Optoelectronic Oscillator with Low Acceleration Sensitivity," *2000 IEEE/EIA International Frequency Control Symposium and Exhibition*, pp. 269-279, Jun. 2000.

Ilchenko, V., et al., "Electrooptically Tunable Photonic Microresonators and Photonic Bandgap Waveguide Coupling for Micro-Optoelectronic Oscillators," *GOMACTech 2003*, Tampa, Florida, pp. 1-4.

Ilchenko, V., et al., "High-Q Microsphere Cavity for Laser Stabilization and Optoelectronic Microwave Oscillator," *Proceedings SPIE Microresonators and Whispering-Gallery Modes*, vol. 3611, pp. 190-198, Jan. 1999.

Ilchenko, V., et al., "Microsphere Integration in Active and Passive Photonics Devices," *Proc. of SPIE Laser Resonators III*, vol. 3930, pp. 154-162, Jan. 2000.

Ilchenko, V., et al., "Microtorus: A High-Finesse Microcavity with Whispering-Gallery Modes," *Optics Letters*, 26(5):256-258, Mar. 2001.

Ilchenko, V., et al., "Pigtailing the High-$Q$ Microsphere Cavity: A Simple Fiber Coupler for Optical Whispering-Gallery Modes," *Optics Letters*, 24(11):723-725, Jun. 1999.

Ilchenko, V., et al., "Sub-Micro Watt Photonic Microwave Receiver," *IEEE Photonics Technology Letters*, 14(11):1602-1604, Nov. 2002.

Ilchenko, V., et al., "Whispering-Gallery-Mode Electro-Optic Modulator and Photonic Microwave Receiver," *J. Opt. Soc. Am. B*, 20(2):333-342, Feb. 2003.

Ito, H., et al., "InP/InGaAs Uni-Travelling-Carrier Photodiode with 310 GHz Bandwidth," *Electronics Letters*, 36(21):1809-1810, Oct. 2000.

Logan, R., et al., "Stabilization of Oscillator Phase Using a Fiber-Optic Delay-Line," *IEEE 45th Annual Symposium on Frequency Control*, pp. 508-512, May 1991.

Maleki, L., "The Opto-Electronic Oscillator: Prospects for Extending the State of the Art in Reference Frequency Generation," *International Topical Meeting on Microwave Photonics*, pp. 195-198, Oct. 1998.

Matsko, A., et al., "Active Mode Locking with Whispering-Gallery Modes," *J. Opt. Soc. Am. B*, 20(11):2292-2296, Nov. 2003.

Matsko, A., et al., "Whispering-Gallery-Mode based Optoelectronic Microwave Oscillator," *Journal of Modern Optics*, 50(15-17):2523-2542, Feb. 2004.

Matsko, A., et al., "Whispering-Gallery-Mode Resonators as Frequency References. I. Fundamental Limitations," *J. Opt. Soc. Am. B*, 24(6):1324-1335, Jun. 2007.

Myers, L.E., et al., "Quasi-Phase-Matched Optical Parametric Oscillators in Bulk Periodically Poled $LiNbO_3$," *J. Opt. Soc. Am. B*, 12(11):2102-2116, Nov. 1995.

Savchenkov, A., et al., "RF photonic signal processing components: From high order tunable filters to high stability tunable oscillators," *IEEE Radar Conference*, pp. 1-6, May 2009.

Savchenkov, A., et al., "Tunable Resonant Single-Sideband Electro-Optical Modulator," *Digest of the IEEE/LEOS Summer Topical Meetings*, pp. 63-64, Jul. 2009.

Savchenkov, A., et al., "Whispering-Gallery-Mode Resonators as Frequency References. II. Stabilization," *J. Opt. Soc. Am. B*, 24(12):2988-2997, Dec. 2007.

Vassiliev, V.V., et al., "Narrow-Line-Width Diode Laser with a High-$Q$ Microsphere Resonator," *Optics Communications*, 158(1-6):305-312, Dec. 1998.

Yao, X.S., et al., "A Novel Photonic Oscillator," *Digest of the LEOS Summer Topical Meetings*, pp. 17-18, Aug. 1995.

Yao, X.S., et al., "A Novel Photonic Oscillator," *TDA Progress Report* 42-122, pp. 32-43, Aug. 1995.

Yao, X.S., et al., "Converting Light into Spectrally Pure Microwave Oscillation," *Optics Letters*, 21(7):483-485, Apr. 1996.

Yao, X.S., et al., "Coupled Optoelectronic Oscillators for Generating Both RF Signal and Optical Pulses," *Journal of Lightwave Tecnhology*, 18(1):73-78, Jan. 2000.

Yao, X.S., et al., "Dual Microwave and Optical Oscillator," *Optics Letters*, 22(24):1867-1869, Dec. 1997.

Yao, X.S., et al., "Multiloop Optoelectronic Oscillator," *IEEE Journal of Quantum Electronics*, 36(1):79-84, Jan. 2000.

Yao, X.S., et al., "Optoelectronic Microwave Oscillator," *J. Opt. Soc. Am. B*, 13(8):1725-1735, Aug. 1996.

Yao, X.S., et al., "Optoelectronic Oscillator for Photonic Systems," *IEEE Journal of Quantum Electronics*, 32(7):1141-1149, Jul. 1996.

Yu, J., et al., "Compact Optoelectronic Oscillator with Ultra-Low Phase Noise Performance," *Electronics Letters*, 35(18):1554-1555, Sep. 1999.

* cited by examiner

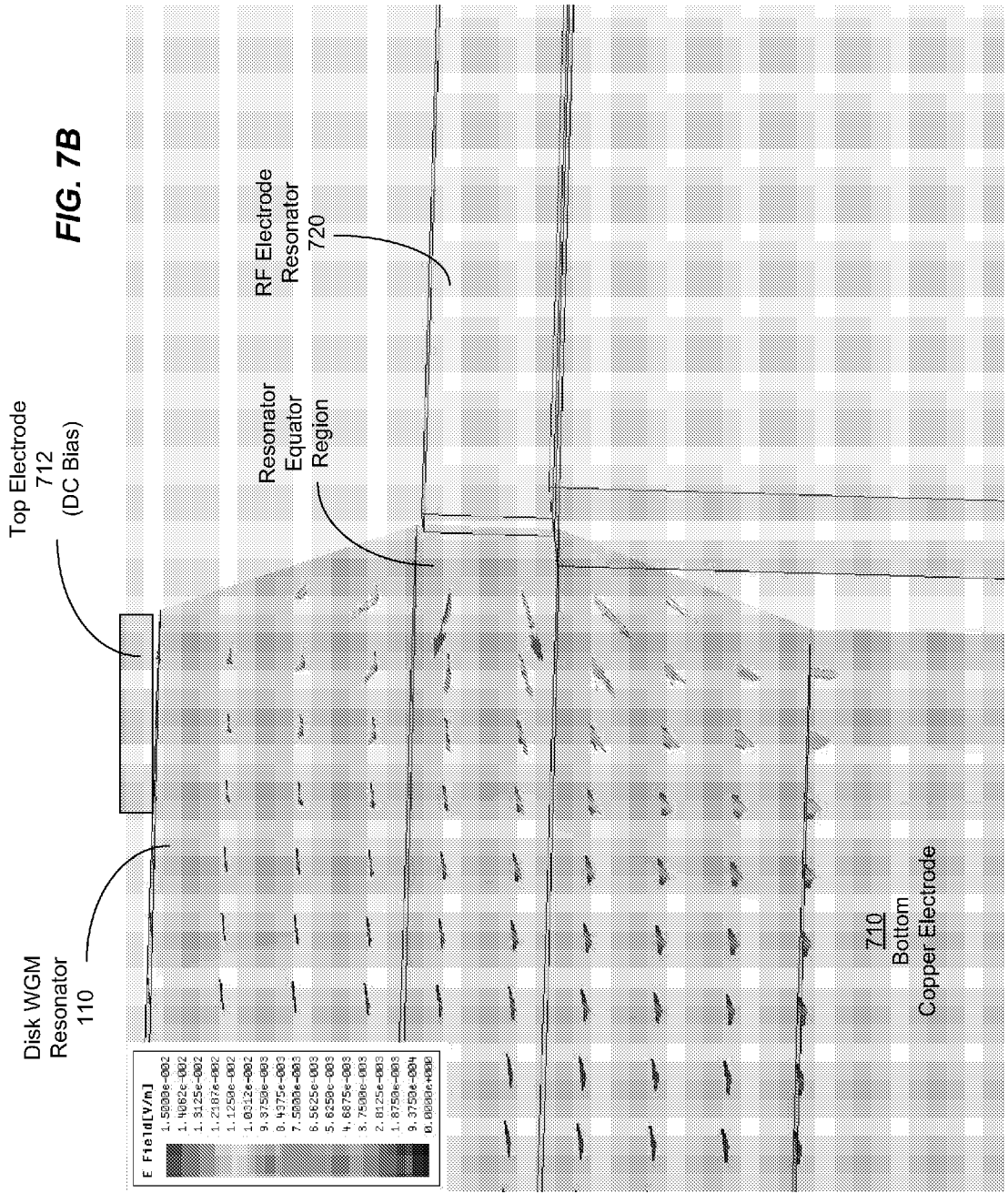

US 8,417,076 B2

TUNABLE PHOTONIC MICROWAVE OR RADIO FREQUENCY RECEIVERS BASED ON ELECTRO-OPTIC OPTICAL WHISPERING GALLERY MODE RESONATORS

PRIORITY CLAIMS AND RELATED APPLICATIONS

This patent document claims the benefits of U.S. Provisional Application. 61/219,187 entitled "Superhetrodyne Photonic Microwave Receiver of Very High Image Frequency Rejection Capability" and filed Jun. 22, 2009, and U.S. Provisional Application. 61/235,932 entitled "Photonic Filters with Dynamically Tunable Bandwidth" and filed Aug. 21, 2009, the disclosures of which are incorporated by reference as part, of the disclosure of this document.

BACKGROUND

This document relates to systems, devices and techniques for using electro-optic optical resonators to process microwave or radio frequency signals.

Optical resonators may be used to spatially confine resonant optical energy in a limited cavity with a low optical loss. The resonance of an optical resonator may be used to provide various useful functions such as optical filtering, optical modulation, optical amplification, optical delay, generation of oscillation signals and others. Light can be coupled into or out of optical resonators via various coupling mechanisms according to the configurations of the resonators.

Optical whispering gallery mode (WGM) resonators are special optical resonators that confine light in one or more whispering gallery modes. Light in a whispering gallery mode propagates in a closed circular optical path and is reflected at the boundary of the resonator due to the total internal reflection. Such as, light in a WGM resonator "leaks" out of the exterior surface of the closed circular optical path of a WGM resonator via the evanescence field of the WG mode. An optical coupler can be used to couple light into or out of the WGM resonator via this evanescent field. WGM resonators can be advantageously used in various optical, photonic, RF and microwave applications.

SUMMARY

This document discloses, among others, examples and implementations of photonic devices and techniques based on tunable single sideband (SSB) modulation in whispering gallery mode resonators formed of electro-optic materials to effectuate coupling between whispering gallery modes of different polarizations.

In one aspect, a whispering gallery mode optical resonator based photonic device is provided to include a single sideband modulator and a frequency control mechanism. The single sideband modulator includes an optical resonator made of an electro-optic crystal and structured to support optical whispering gallery modes in a first polarization mode and a second polarization mode orthogonal to the first polarization mode, both of which circulate near a rim of the optical resonator, and electrodes formed on the optical resonator to receive an RF or microwave signal to the optical resonator in an electric field polarization oriented relative to a crystal axis of the electro-optic crystal to effectuate coupling between an optical whispering gallery mode in the first polarization mode and another optical whispering gallery mode in the second polarization mode to produce an optical single sideband by modulation of continuous wave light at an optical carrier frequency at a sideband frequency different from the optical carrier frequency. The frequency control mechanism is coupled to the optical resonator to tune a frequency spacing between the optical single sideband and the optical carrier frequency.

In another aspect, a method for operating a whispering gallery mode optical resonator to produce a tunable signal modulation is provided. This method includes coupling input continuous wave (CW) light at an optical carrier frequency into an optical resonator made of an electro-optic crystal and structured to support optical whispering gallery modes in a first polarization mode and a second polarization mode orthogonal to the first polarization mode, both of which circulate near a rim of the optical resonator. This method also includes coupling an RF or microwave signal to the optical resonator in an electric field polarization oriented relative to a crystal axis of the electro-optic crystal to effectuate coupling between an optical whispering gallery mode in the first polarization mode and another optical whispering gallery mode in the second polarization mode to produce an optical single sideband on light in the optical resonator at a frequency different from the optical carrier frequency. In this method, an external control is applied to the optical resonator to tune frequencies of the optical whispering gallery modes in both the first and second polarization modes to adjust a frequency spacing between the optical single sideband and the optical carrier frequency without being limited to a free spectral range of the optical resonator.

These and other aspects, associated examples and implementations are described in detail in the drawings, the description, and the claims.

BRIEF DESCRIPTION OF THE DRAWINGS

FIGS. 7A, 7B, 7C and 7D show an example of an RF or microwave electrode design for a tunable SSB WGM resonator modulator.

DETAILED DESCRIPTION

Tunable single sideband (SSB) modulators as described in this document and other devices and systems based on such tunable SSB modulators use WGM resonators made of suitable electro-optic materials that lead to coupling between two orthogonally polarized whispering gallery modes in response to an applied RF signal. The coupling between two orthogonally polarized whispering gallery modes is used to achieve the SSB modulation and the tuning of the frequencies of the two orthogonally polarized whispering gallery modes is used to tune the frequency of the signal modulation. This tuning can be independent of the free spectral range of the WGM resonator and thus can be beneficial in various applications, including signal modulation and signal generation applications, wherein frequency tuning is needed.

WGM resonators can be structured to be axially or cylindrically symmetric around a symmetry axis around which the WG modes circulate in a circular path or the equator. The exterior surface of such a resonator is smooth and provides spatial confinement to light around the circular plane to support one or more WG modes. The exterior surface may be curved toward the symmetry axis to spatially confine the light along the symmetry axis. A WGM resonator may be shaped symmetrically around a symmetry axis and has a protruded belt region to form a circular path to confine light in one or more WG modes. The exterior surface of the protruded belt region may be any suitable geometrical shape such as a flat surface or a curved surface. Such a WGM resonator may be configured in a desired physical size for a given wavelength of light. Various materials can be used for WGM resonators and include, for example, crystal materials and non-crystal materials. Some examples of suitable dielectric materials include fused silica materials, glass materials, lithium niobate materials, and calcium fluoride materials.

A whispering gallery mode resonator can be made of a material exhibiting an electro-optic effect and can include electrodes on the optical resonator to apply an RF or microwave signal to the optical resonator to effectuate the electro-optic effect to control the one or more optical whispering gallery modes circulating along a circular optical loop near a rim of the optical resonator. The electro-optic effect in such a WGM resonator can be used to tune the resonance of the WGM resonator and to modulate light.

Figure 1A:
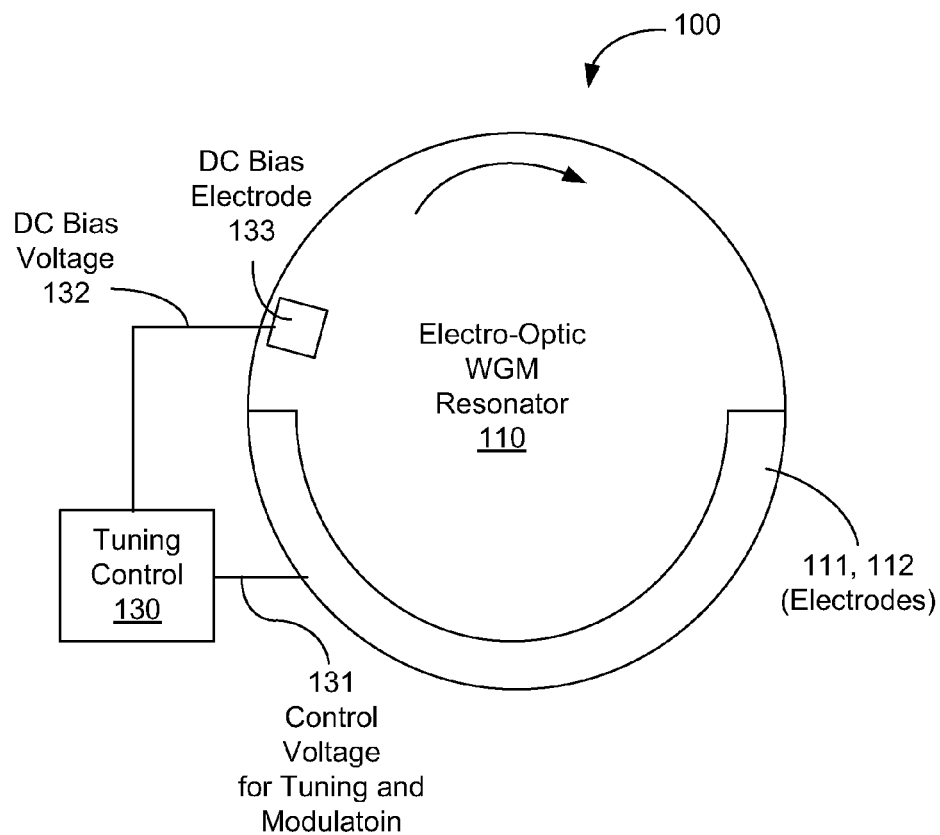
FIGS. 1A and 1B show an example of a tunable electro-optic WGM resonator modulator for single sideband (SSB) modulation.
Figure 1B:
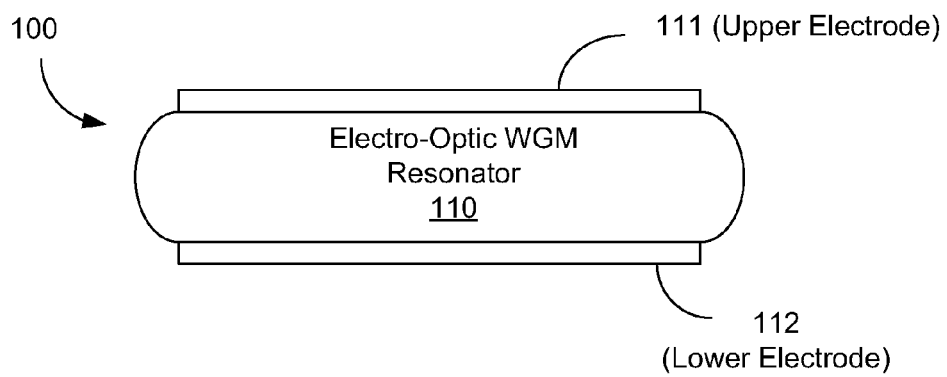

FIGS. 1A and 1B show an example of an electro-optic modulator (EOM) 100 having an electro-optic WGM resonator 110. The electro-optic material for the entire or part of the resonator 110 may be an electro-optic crystal or a semiconductor multiple quantum well structure. One or more electrodes 111 and 112 may be formed on the resonator 110 to apply a control electrical field in at least the region where the WG modes are present to control the index of the electro-optical material and to change the filter function of the resonator. Assuming the resonator 110 has disk or ring geometry, the electrode 111 may be formed on the top of the resonator 110 and the electrode 112 may be formed on the bottom of the resonator 110 as illustrated in the side view of the device in FIG. 1B. In one implementation, the electrodes 111 and 112 may constitute an RF or microwave resonator to apply the RF or microwave signal to co-propagate along with the desired optical WG mode. For example, the electrodes 111 and 112 may be microstrip line electrodes. The electrodes 111 and 112 may also form an electrical waveguide to direct the electrical control signal to propagate along the paths of the WG modes. A tuning control unit 130 such as a control circuit may be used to supply the electrical control signal 131 to the electrodes 111 and 112.

In operating the resonator modulator 100, the control unit 130 may supply a voltage as the electrical control signal to the electrodes 111 and 112 as the modulation control signal. A DC bias electrode 133 can be provided to supply a DC voltage 132 to set the resonance peak of the resonator 100 at a desired spectral location. The DC voltage may be adjusted by the control unit 630 to tune the spectral position of the transmission peak when such tuning is needed.

For example, a Z-cut $LiNbO_3$ disk cavity with a diameter of d=4.8 mm and a thickness of 170 μm may be used as the resonator 610. The cavity perimeter edge may be prepared in the toroidal shape with a 100 μm radius of curvature. As an alternative to the strip electrodes shown in FIG. 1A, the top and bottom surfaces of the disk resonator may be coated with conductive layers for receiving the external electrical control signal. A metal such as indium may be used to form the conductive coatings. The signal modulation is achieved by applying and adjusting a modulation control voltage to the top and bottom conductive coatings. Each conductive coating may be absent on the central part of the resonator and are present at the perimeter edge of the resonator where WGMs are localized.

The electro-optic modulator (EOM) in FIGS. 1A and 1B may be constructed based on coupling between WGM modes of the same polarization via the electro-optic effect. Such EOM devices can be tuned in frequency but the tuning is limited by the free spectral range (FSR) of the WGM modes of the WGM resonator.

Certain electro-optic materials exhibit non-zero off-diagonal elements of their electro-optic tensors and can be used to effectuate coupling of two orthogonally polarized WG modes of an electro-optic WGM resonator modulator via interaction with the applied RF or microwave (MW) signal. This RF/MW-coupled interaction between two family modes of orthogonal polarizations, e.g. the transverse magnetic (TM) mode and the transverse electric (TE) mode, can be used to construct an electro-optic WGM resonator modulator to achieve tunable single sideband (SSB) modulation. For example, based on the modulator design in FIGS. 1A and 1B, WGM resonators made of $LiNbO_3$ and $LiTaO_3$ or other electro-optic crystals with the desired non-zero off-diagonal elements of their electro-optic tensors can be used to create coupling between light and RF fields, achieved by engineering the shape of a micro-strip RF resonator coupled to a WGM resonator. The modulation is achieved between the WGM modes separated not by the free spectral range (FSR) of the resonator, but rather by some frequency given by the resonator shape, temperature, and the bias voltage.

The light confined in two optical WGMs characterized with electric field operators $\vec{E}_1$ and $\vec{E}_2$ is coupled with the RF field $\vec{E}_M$ in the case of nonzero interaction energy $$E = \frac{1}{8\pi} \int_V \sum_{i,j,k} r_{ijk} D_i D_j E_{Mk} \, dv,$$

where $r_{ijk}$ describes the space dependent electro-optic nonlinearity of the resonator host material, $D_i = \Sigma_j \epsilon_{ij} E_j$, electric field $E_l$ is presented as a sum of two counter-propagating waves, and V is the volume of the WGM resonator.

The interaction between two WGM mode families having different polarizations allows the two WGM mode families to be tuned with respect to each other using the same tuning mechanism, e.g., adjusting the DC bias voltage applied to the resonator. The interaction of two WGM mode families allows the single sideband modulation in the system.

The interaction between the light and RF signal is not always possible. For instance, if the RF field is homogeneous and is applied along, e.g., Z-axis of a lithium niobate WGM resonator, the coupling between the optical TM modes with the electric field parallel to the Z axis and the optical TE modes with the electric field perpendicular to the Z axis is forbidden. It is possible to realize resonators where neither pure TE nor pure TM mode families exist. The interaction is allowed among those modes if the spatial overlap integral between the modes is not zero.

Electro-optic materials with non-zero non-diagonal elements of their linear electro-optic tensors can be used to achieve interaction of two orthogonally polarized modes. For example, lithium niobate has nonzero electro-optic coefficients r42=r51. Those coefficients introduce coupling between TE and TM WGMs in a resonator fabricated from a z-cut LiNbO3 preform if the RF field has a radial component. The space averaged interaction energy for the optical and RF fields is given by $$E = \frac{n_e^2 n_o^2}{4\pi} \int_V r_{51}(\vec{E}_{TM} \cdot \vec{E}_{RF}) E_{TE}^* dv,$$

where the condition of $\vec{E}_{TE} = \vec{z} E_{TE}$ is applied. The averaged interaction energy is generally zero because $n_e \neq n_o$. However, either periodical poling of the material or creating a special electrode shape for the RF mode phase matches the interaction such that $E \neq 0$. A composite resonator can be fabricated from, e.g., x-cut and z-cut cylindrical segments attached together so that the nonzero interaction can be achieved.

Figure 2:
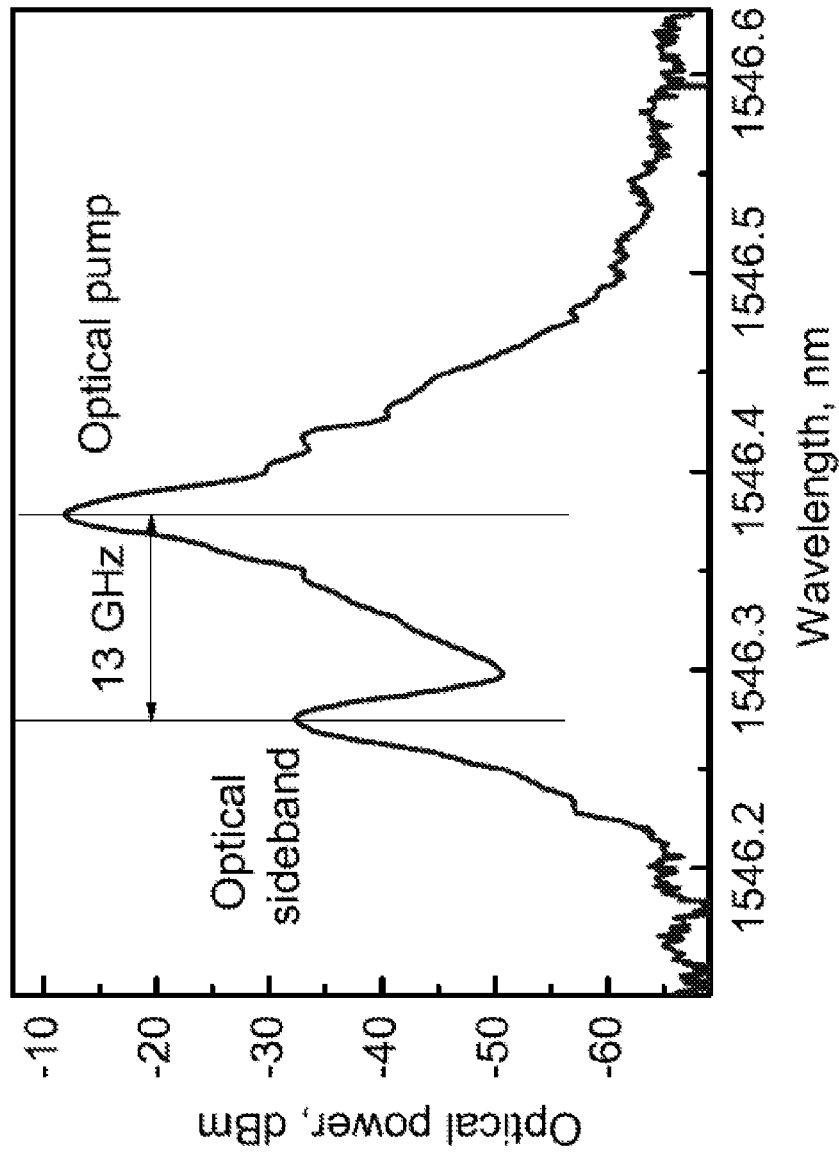
FIGS. 2, 3, 4A and 4B illustrate operations of the modulator for SSB modulation in FIGS. 1A and 1B.

FIG. 2 shows a measured optical spectrum obtained from an exemplary SSB EOM modulator using a lithium niobate crystal WGM resonator having a 35-GHz free spectral range. The interaction of TE and TM mode families was effectuated to achieve single sideband modulation where only one sideband was generated at the spacing of 13 GHz from the optical frequency of the optical pump light. The resonator modulation was achieved between the TE and TM modes separated not by the free spectral range (35 GHz) of the resonator, but rather by some value (13 GHz) given by the resonator shape, the resonator temperature, and the bias voltage applied to the resonator. For two WGM mode families having different polarizations, optical frequencies of the two mode families are shifted with respect to each other in the frequency space. As such, it is possible to realize single sideband tunable modulation in the system.

Figure 3:
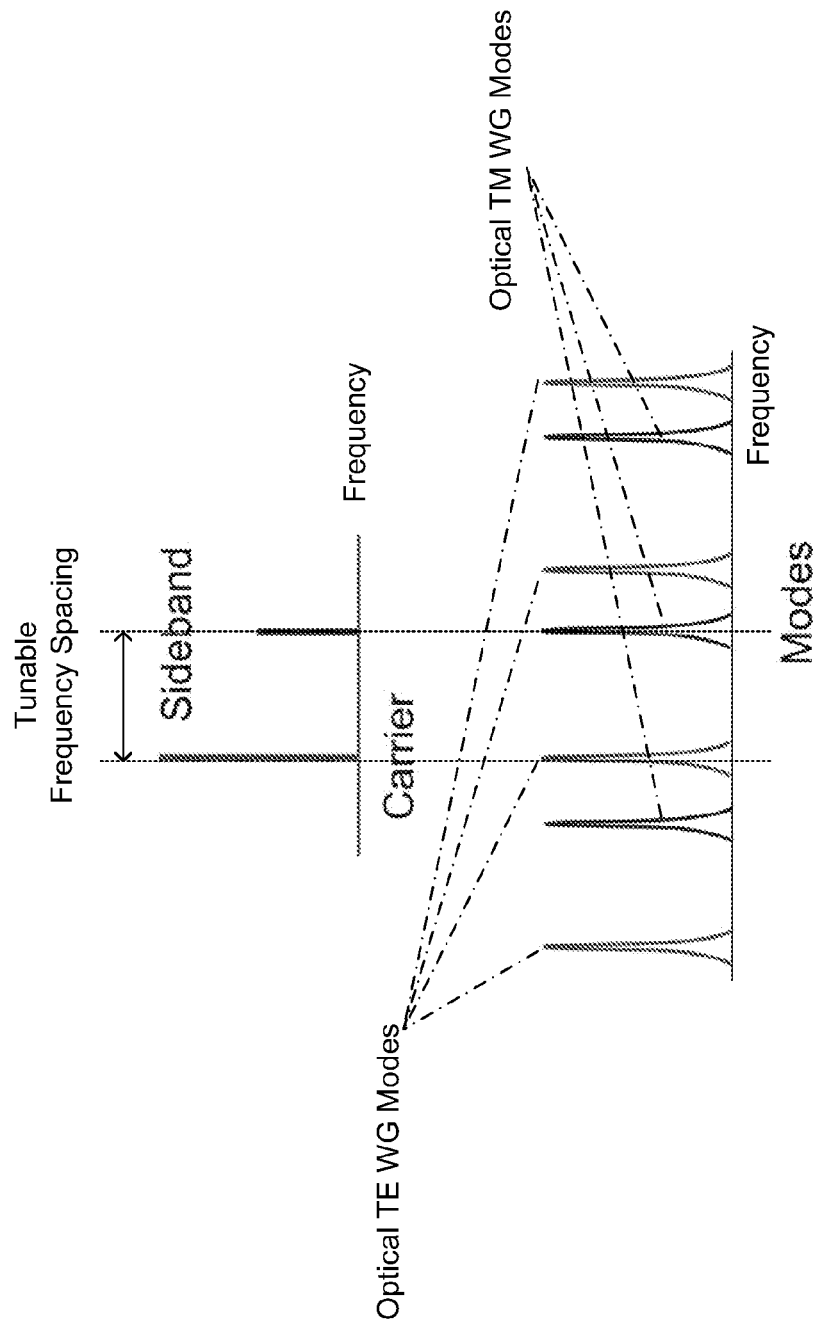

FIG. 3 illustrates the spectral properties of SSB modulation in an electro-optic WGM resonator modulator configured under the design in FIGS. 1A and 1B. The upper diagram shows the entire spectrum of the optical output of the electro-optic WGM resonator modulator without any optical filtering, where only a single modulation sideband is generated on one side of the optical carrier. The lower diagram shows two families of WG modes with orthogonal polarizations (TE and TM modes) that support light at the optical carrier frequency and the generated single sideband. This TE-TM waveguide mode coupling via off-diagonal elements of the electro-optic tensor of the modulator host material is a departure from the resonant electro-optic WGM resonator modulators based on coupling between modes of the same family (TE-TE or TM-TM) using diagonal elements of an electro-optic tensor of the host electro-optic material. Referring to FIGS. 1A and 1B, the shape of the RF electrodes applied to an electro-optic crystal (e.g., Z-cut lithium tantalite crystal) in a WGM resonator can be structured to effectuate an efficient coupling of TE whose electric field is perpendicular to the Z axis and TM whose electric field is parallel to the Z axis, where the Z axis is the symmetry axis of the resonator coinciding with the c axis of the crystal.

Notably, the TE and TM WGM modes respectively at the optical carrier frequency and the frequency of the single sideband in FIG. 3 is separated not by the optical free spectral range of the WGM resonator, but rather by some frequency determined by the electro-optic effect in the resonator, e.g., determined by one or combination of various influences that affect the electro-optic effect in the resonator, e.g., resonator shape, temperature, and the bias voltage. Based on this, the TE and TM mode families can be tuned with respect to one another using the electro-optic effect by changing the electro-optic coefficients for agile tunability of the modulation frequency which is the difference between the optical carrier, and the frequency of the generated single sideband (upper diagram of FIG. 3). The tenability comes from the different response of the TE and the TM modes to an external energy or influence applied to the crystal for changing the electro-optic coefficients. One exemplary technique for tuning this frequency is to change a DC bias voltage on the crystal. One another exemplary technique for tuning this frequency change the temperature of the crystal. Yet another exemplary technique for tuning this frequency is to apply a force to compress the crystal.

Figure 4A:
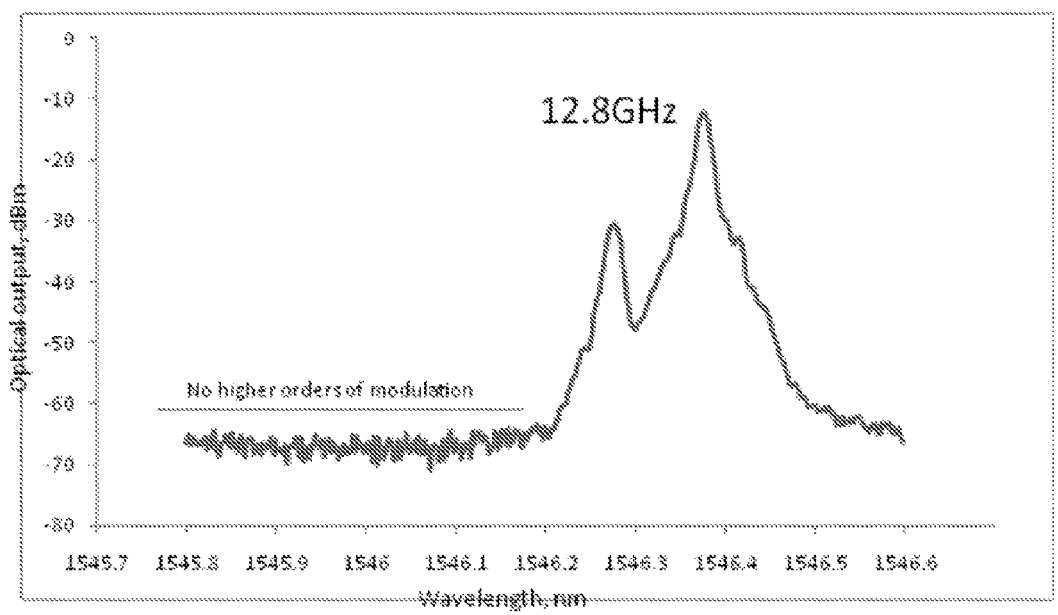
Figure 4B:
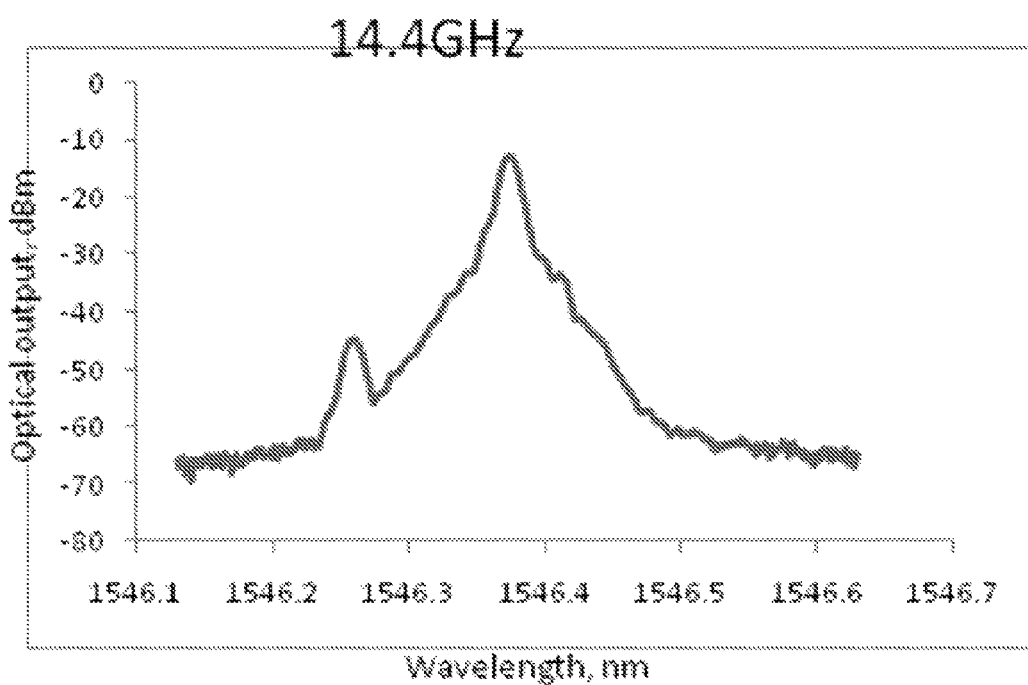

FIGS. 4A and 4B show measurements of optical spectra of a SSB modulator made of a lithium niobate WGM resonator under two different DC bias voltages. FIG. 4A shows a frequency spacing of about 12.8 GHz between the SSB peak and the optical carrier frequency under a first DC bia voltage and FIG. 4B shows a frequency spacing of about 14.4 GHz between the SSB peak and the optical carrier frequency under a second, different DC bia voltage. Therefore, the DC bias voltage is adjusted to tune the modulation frequency from 12.8 GHz to 14.4 GHz.

In this regard, the SSB modulation provides a method for operating a WGM resonator to achieve SSB operation. This method includes coupling light into an optical resonator made of a crystal (e.g., a ferroelectric crystal) and structured to support optical whispering gallery modes in two orthogonally polarized TE and TM modes circulating along a circular optical loop near a rim of the optical resonator; and applying an RF or microwave signal to the optical resonator in an electric field polarization oriented relative to a crystal axis of the crystal to effectuate coupling between light in an optical whispering gallery mode in the TE mode and light in another optical whispering gallery mode in the TM mode to produce a tunable optical single sideband modulation at a modulation frequency equal to a difference in optical frequencies of the optical whispering gallery modes in the TE and TM modes.

The SSB modulation can be analyzed as the follows. For a resonator with nonzero interaction energy, the interaction between two optical WGMs with orthogonal polarizations and RF field can be achieved via the coupling of the modes:

$$\dot{A} = -\Gamma_A A - ig^* BC^* + F_A,$$

$$\dot{B} = -\Gamma_B B - igCA,$$

$$\dot{C} = -\Gamma_C C - ig^* BA^* + F_M,$$

where $$\Gamma_A = i(\omega_0 - \omega) + \gamma + \gamma_c,$$

$$\Gamma_B = i(\omega_+ - \omega - \omega_M) + \gamma + \gamma_c,$$

$$\Gamma_C = i(\omega_c - \omega_M) + \gamma_M + \gamma_{Mc},$$

and A, B, and C are the normalized slowly-varying amplitudes of the optical and RF fields respectively; $\omega$, $\omega+$, and $\omega c$ are the optical and RF mode eigenfrequencies, $\gamma$ and $\gamma M$ ($\gamma c$ and $\gamma Mc$) are the decay rates determined by the loss in the optical and RF resonators (coupling with the resonators), the pumping forces FA and FM are introduced as $$F_A = e^{i\phi_0}\sqrt{\frac{2P\gamma_c}{\hbar\omega_0}}, \quad F_M = e^{i\phi_M}\sqrt{\frac{2P_{RF}\gamma_{M_c}}{\hbar\omega_M}},$$

where P and PRF are the values of the optical and RF pump power, φ0 and φM are the optical and RF phases. The relative electric field amplitudes of the radiation exiting the resonator can be represented by $$\frac{A_{out}}{A_{in}} = 1 - 2\gamma_c \frac{A}{F_A},$$

$$\frac{B_{out}}{A_{in}} = -2\gamma_c \frac{B}{F_A},$$

$$\frac{C_{out}}{C_{in}} = 1 - 2\gamma_{M_c} \frac{C}{F_M}.$$

When the overlap integral of the optical and RF fields to approach unity, the absolute value of the coupling parameter g becomes nearly equal to $$|g_0| = \omega_0 r_{51} \frac{n_e n_o}{2}\sqrt{\frac{2\pi\hbar\omega_M}{n_M^2 V_M}},$$

where ω0 is the optical carrier frequency, ωM is the RF frequency, r51 is the nondiagonal electro-optic coefficient of the material, ne and no are the extraordinary and ordinary indexes of refraction of the material, n2 M=−M is the low frequency dielectric susceptibility of the material, VM is the mode volume for the RF field.

The coefficient |g0| determines the maximum value of the RF-optical coupling that can be achieved in the resonator. A phase matching parameter $$\zeta = \frac{|g|}{|g_0|} = \frac{1}{\sqrt{V_a V_b}}\left|\int \frac{r_{51}(v)}{r_{51}}\Phi_a \Phi_b^* \Phi_c^* dv\right| < 1,$$

is introduced to show how the maximum coupling deteriorates because of the phase mismatch. The spatial distribution of the electric field, e.g. Φa, in the modes is normalized as follows $$\frac{1}{V_a}\int_V |\Phi_a|^2 dv = 1,$$

The distributions Φb are Φc are normalized in the same way. The steady state solution of the above set of equations is $$\frac{A_{out}}{A_{in}} = \frac{\Gamma_B(\Gamma_A - 2\gamma_c) + |\tilde{g}|^2}{\Gamma_B\Gamma_A + |\tilde{g}|^2},$$

$$\frac{B_{out}}{A_{in}} = i\frac{2\gamma_c \tilde{g}}{\Gamma_B\Gamma_A + |\tilde{g}|^2},$$

where ˜g=|g||C|, C≈FM/ΓM, and γ+γc>>|g||A|. The signal voltage generated on a fast photodiode with resistivity ρpd and responsivity R due to beating of the carrier (Aout) and sideband (Bout) light is $$\frac{V_{pdmw}}{\rho_{pd}\mathcal{R}\,P} = i\frac{2\gamma_c\tilde{g}[\Gamma_B^*(\Gamma_A^* - 2\gamma_c) + |\tilde{g}|^2]}{|\Gamma_B\Gamma_A + |\tilde{g}|^2|^2},$$

Consider the case when both optical modes are overloaded. For the low enough RF signal power we find the ratio of the output (demodulated) RF power and the input RF power.

$$G \approx \rho_{pd}\mathcal{R}^2 \frac{P^2}{P_{RF}}\left[\frac{2\tilde{g}}{\gamma_c}\left(1 - \frac{3|\tilde{g}|^2}{\gamma_c^2}\right)\right]^2.$$

This is a so called photonic gain of the device. We introduce characteristic RF power of the EOM as $$\frac{P_{RF}}{P_{RF0}} = \frac{4\tilde{g}^2}{\gamma_c^2},$$

so that $$P_{RF0} = \frac{1}{16Q^2 r_{51}^2 \zeta^2 n_e^2 n_o^2}\frac{\gamma_M + \gamma_{M_c}}{2\gamma_M}\frac{\omega_M}{Q_M}\frac{n_M^2 V_M}{\pi},$$

and rewrite the expression for the gain as $$G \approx \rho_{pd}\mathcal{R}^2 \frac{P^2}{P_{RF0}}\left[1 - \frac{3P_{RF}}{4P_{RF0}}\right]^2.$$

where Q=ω0/(2γc) and QM=ωM/(2(γM+γMc)). The gain is nearly constant ($\rho_{pd}\mathcal{R}^2 P_{in}^2/P_{RF0}$) up to the input RF power reaches $P_{RF\,sat}$ 0.4$P_{RF\,0}$. Assuming that $\omega_0$=2π×2×10$^{14}$ s$^{-1}$, γC=2π×0.5×10$^6$ s$^{-1}$, γ$M_c$=γM, $Q_M$=80, $\omega_M$=2π×35×10$^9$ s$^{-1}$, ζ=0.1, $V_M$=5×10$^{-6}$ cm$^3$, $n_M$=6.6, $n_o$=$n_e$=2.1, $r_{51}$=20 pm/V, the value of $P_{RF0}$ is 70 μW and the EOM saturates at 28 μW. The saturation power can be increased in many ways, for example, by increasing thickness of the WGM resonator. The maximal photonic gain is given by the optical power circulating in the system.

The dependence of the photonic gain on the RF frequency is analyzed below. It is assumed that the pumping laser is resonant with one of the optical modes. Far from saturation, the photonic gain has a Lorentzian spectral dependence with FWHM given by the optical resonance FWHM $$\frac{G(\omega_M)}{G(\omega_M = \omega_{FSR})} = \frac{\gamma_c^2}{(\omega_M - \omega_{FSR})^2 + \gamma_c^2}.$$

Notably, at higher RF powers, the gain curve broadens and splits into two gain peaks. To achieve high spectral purity with an opto-electronic oscillator (OEO) that includes the SSB modulator, the gain of the RF amplifier should be selected in such a way that the SSB modulator remains unsaturated. This can be achieved with a tunable attenuator. Assuming linear amplification GRF and linear attenuation αRF in the RF circuit we need to balance their values such that $$\left[1 - \frac{3P_{RF}}{4P_{RF0}}\right]^2 = (\alpha_{RF} G_{RF} G(\omega_M = \omega_{FSR}, P_{RF} \to 0))^{-1},$$

and $2P_{RF0} \gg 3P_{RF}$.

Figure 5:
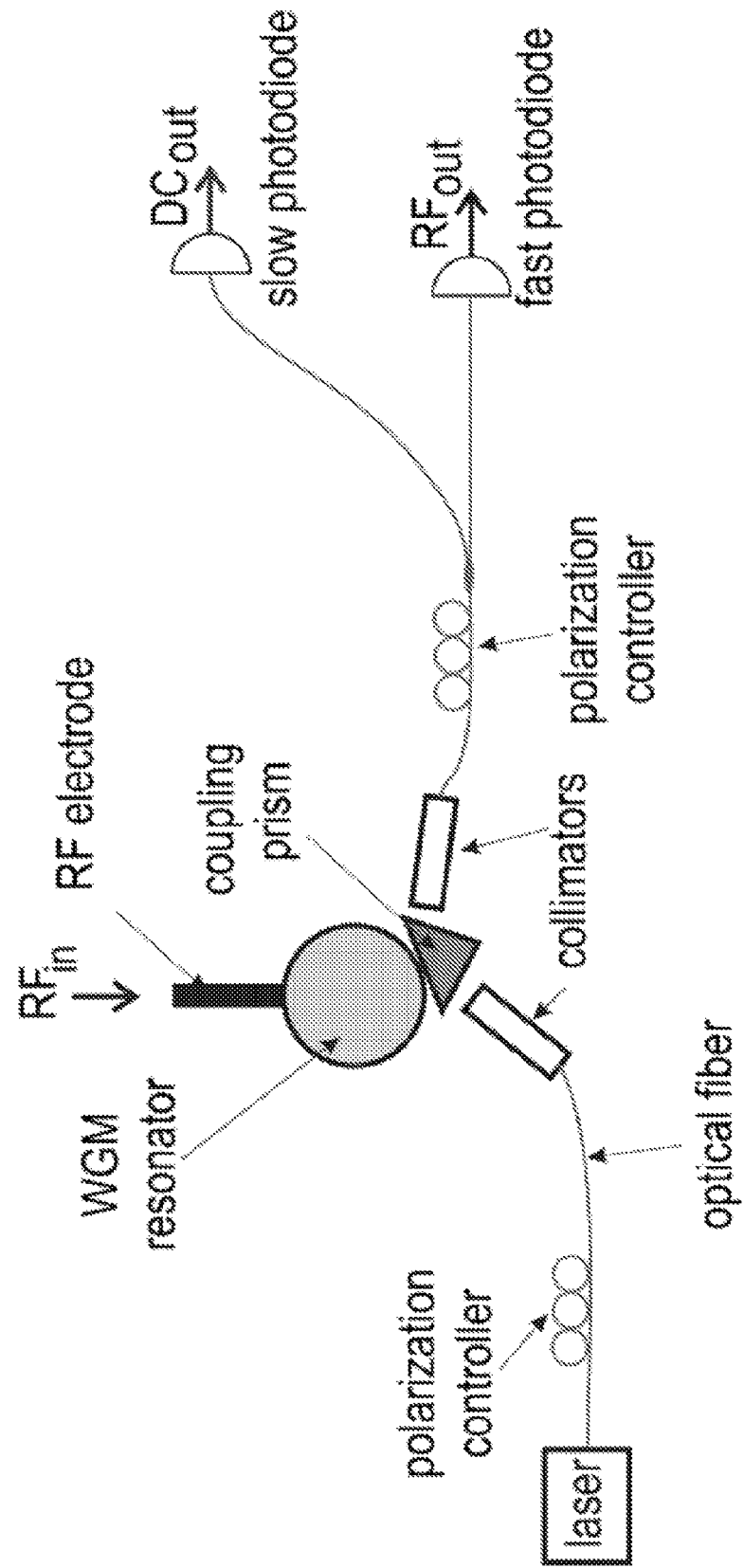
FIG. 5 shows an example of a tunable SSB WGM resonator modulator.
Figure 6:
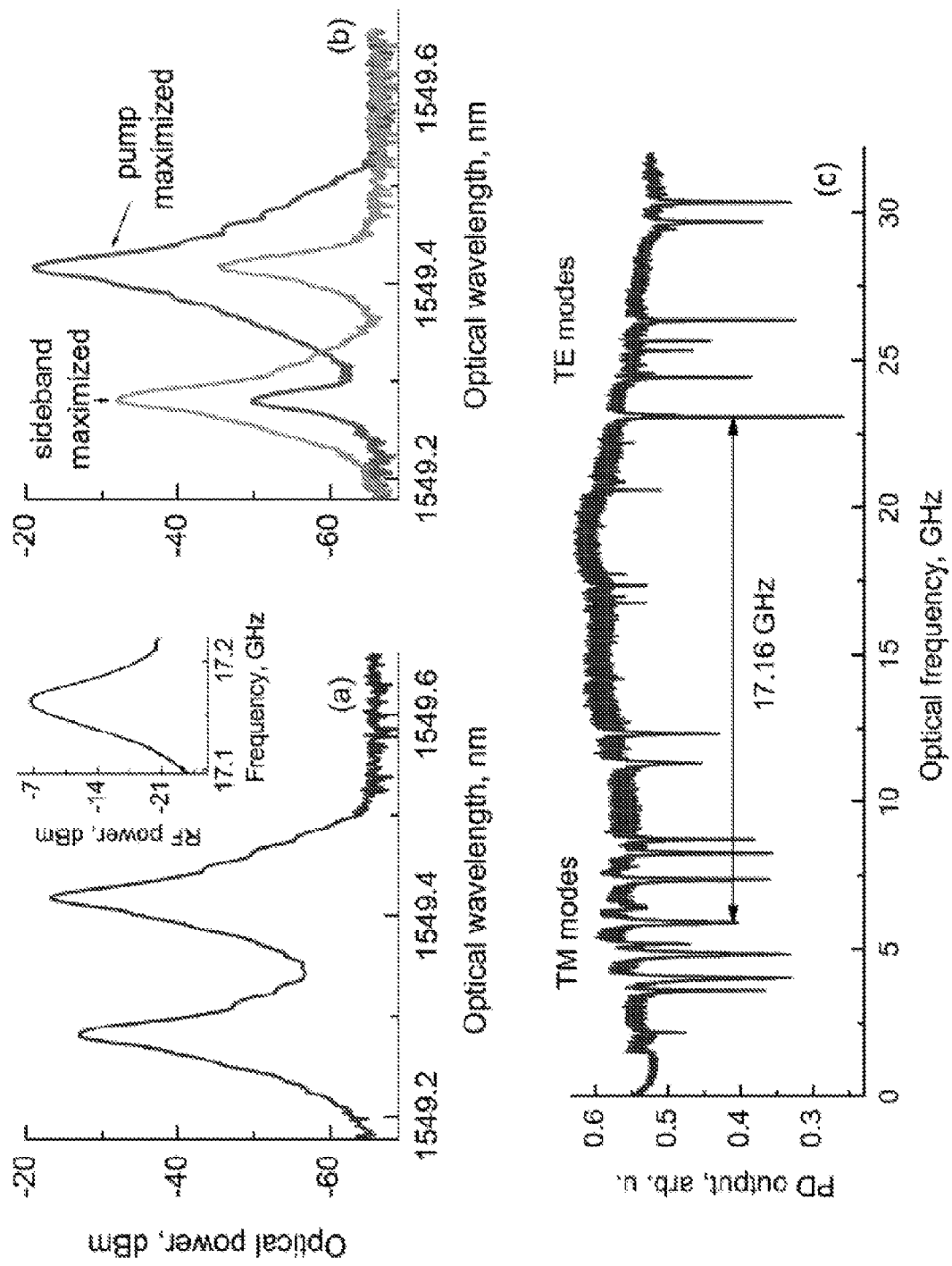
FIG. 6 shows measurements obtained in the modulator in FIG. 5.

As specific examples, WGM resonators made of LiNbO$_3$ and LiTaO$_3$ can be used for SSB modulators to create coupling between light and RF fields, achieved by engineering the shape of a micro-strip RF resonator coupled to a WGM resonator. FIG. 5 shows an example of such a SSB modulator based on an electro-optic WGM resonator and FIG. 6 shows measurements obtained from this SSB modulator.

In FIG. 5, a toroidal WGM resonator is placed to a conductive substrate and an rf electric field is applied to its rim. The resonator is fabricated of Z-cut lithium tantalate and the symmetry axis of the resonator coincides with the c axis of the crystal. The stripline rf electrode is situated in the direct vicinity of the localization of the basic WGM sequence. The electrode is designed in such a way that the rf electric field is polarized orthogonally to the surface of the resonator and is maximized at the extremity perimeter of the resonator. A dc electric field is applied along the Z axis of the resonator to tune the WGM spectrum.

Light from a laser is coupled into and out of the WGM resonator via a coupling prism. Optical collimators are used for coupling light into and out of the prism in such a way that the fundamental TM and TE mode sequences (the closest to the resonator surface) are excited with the light. In conducted tests, a WGM resonator of a diameter of 935 µm and 100 µm in thickness was used and was measured to have an optical free spectral range of 48 GHz. The rim of the resonator was shaped as a toroid such that the cross section of the modes belonging to the basic WGM family with nearly orthogonal polarizations was an ellipse with dimensions of 1.6 µm and 7.5 µm. All the modes have approximately the same intrinsic (unloaded) quality factor resulting from the material absorption, reaching $6 \times 10^8$ at 1550 nm for the particular sample. The resonator was overloaded with the prism so that the FWHM of the TE and TM modes became 1 and 20 MHz, respectively.

As illustrated in FIG. 5, a first polarization controller is provided between the laser and the WGM resonator to control the input polarization so that both light in both TM and TE modes is present in the resonator. A second polarization controller in the output path of the light coupled out of the resonator. Two photodetectors are used in FIG. 5 to measure different signal components in the output light of the SSB modulator. A fast photodiode is used to measure the RF output and a slow photodiode is used to measure the DC output. In this SSB WGM modulator, the pump light and the light in the single sideband are orthogonally polarized with respect to each other. This feature allows for implementation of a polarization selective detection to reduce the noise in the optical to RF conversion part of the device.

FIG. 6 shows measurements of the performance of the above exemplary SSB modulator. FIG. 6(a) shows the measured spectrum of the light exiting the modulator showing presence of only one sideband. The inset in FIG. 6(a) shows the spectrum of the RF return of the optical signal demodulated on a fast photodiode showing the resonant modulation frequency of 17.16 GHz and the spectral width of 20 MHz. The angle of the polarizer installed after the WGM resonator is selected such that the rf return power is maximized. FIG. 6(b) shows the measured optical spectrum shown in FIG. 6(a) with the polarizer installed after the resonator tuned ±45° with respect to the position selected to obtain FIG. 6(a). Hence, the optical carrier and the sideband are polarized orthogonally. FIG. 6(c) shows the measured optical spectrum of the WGM resonator showing the modes involved with the modulation process.

In the conducted measures, application of the rf field to the RF electrode caused the modulation at the separation frequency of TE and TM modes shown in FIG. 6(a). The modulation was measured by using both an optical spectrum analyzer and an rf spectrum analyzer. The modulation has only one first-order sideband, no second-order sideband, and no symmetrical sideband. The experimentally measured sideband suppression exceeds 40 dB and is given by the noise floor of our spectrum analyzer. A coherent detection technique was used to improve the measurement sensitivity by 20 dB and the second sideband was not detected in the measured spectrum. The optical polarizer placed after the modulator was rotated to suppress either the carrier or the sideband, proving that they are orthogonally polarized as shown in FIG. 6(b).

The above measurements indicate that the coupling between TM and TE modes was efficient in the tested device. The optical sideband power became equal to the carrier power only for 2 mW of rf power applied to the resonator. The light escaping the modulator was captured by the slow photodiode and the changes caused by loading the resonator was tracked with and without the applied rf field. The spectrum of the optically pumped mode appears as a dip if no rf field is present; the dip decreases if the rf field is applied. Pumping light into the spectrally broader mode caused the appearance of a narrow transparency peak inside the absorption curve.

The SSB modulator is tunable by tuning either or both of the temperature of the resonator and the DC voltage applied to the top and the bottom surfaces of the resonator. Tests were conducted to show a frequency shift of the WGM spectrum caused by the temperature change and the DC voltage change. The TE and the TM modes shift with different rates so that the relative frequency of the mode families changes resulting in modification of the modulation frequency. Measurments showed 1 GHz/K thermal and 80 MHz/V electro-optical shifts of the modulation frequency. In tuning the modulation frequency, the frequency of the laser carrier is tuned to follow one of the WGMs. One of the advantages of the electro-optical frequency tuning is its agility, and the tuning speed reaches 1 GHz/µs for the setup reported here. The tunability range can approach tens of gigahertz and is fundamentally limited either by the damage of the material with the applied dc electric field (2 kV/mm for stoichiometric LiTaO3) or by the mechanical damage from the differential thermal expansion of the setup.

In the interaction of the light confined in TE and TM mode families for achieving the single sideband modulation in the above WGM resonator having an FSR of 48 GHz, the second sideband rejection (SSR) was measured to be greater than 70 dBc.

The modulation frequency was tuned from 10.5 GHz to 14.5 GHz with +50 V DC bias change and this tuning can be readily extended to 20 GHz and beyond using a DC bias voltage of ±100 V or greater applied to the resonator. Wider band thermal tunability was also demonstrated. The possibility of increasing the modulation bandwidth of the EOMs without significant efficiency deterioration one of advantages of the SSB modulation. The RF bandwidth of the tested SSB modulator was approximately 20 MHz. Wider bandwidths of 1 GHz or more can be achieved by using smaller WGM resonators and the interaction of different WGM families.

Figure 7A:
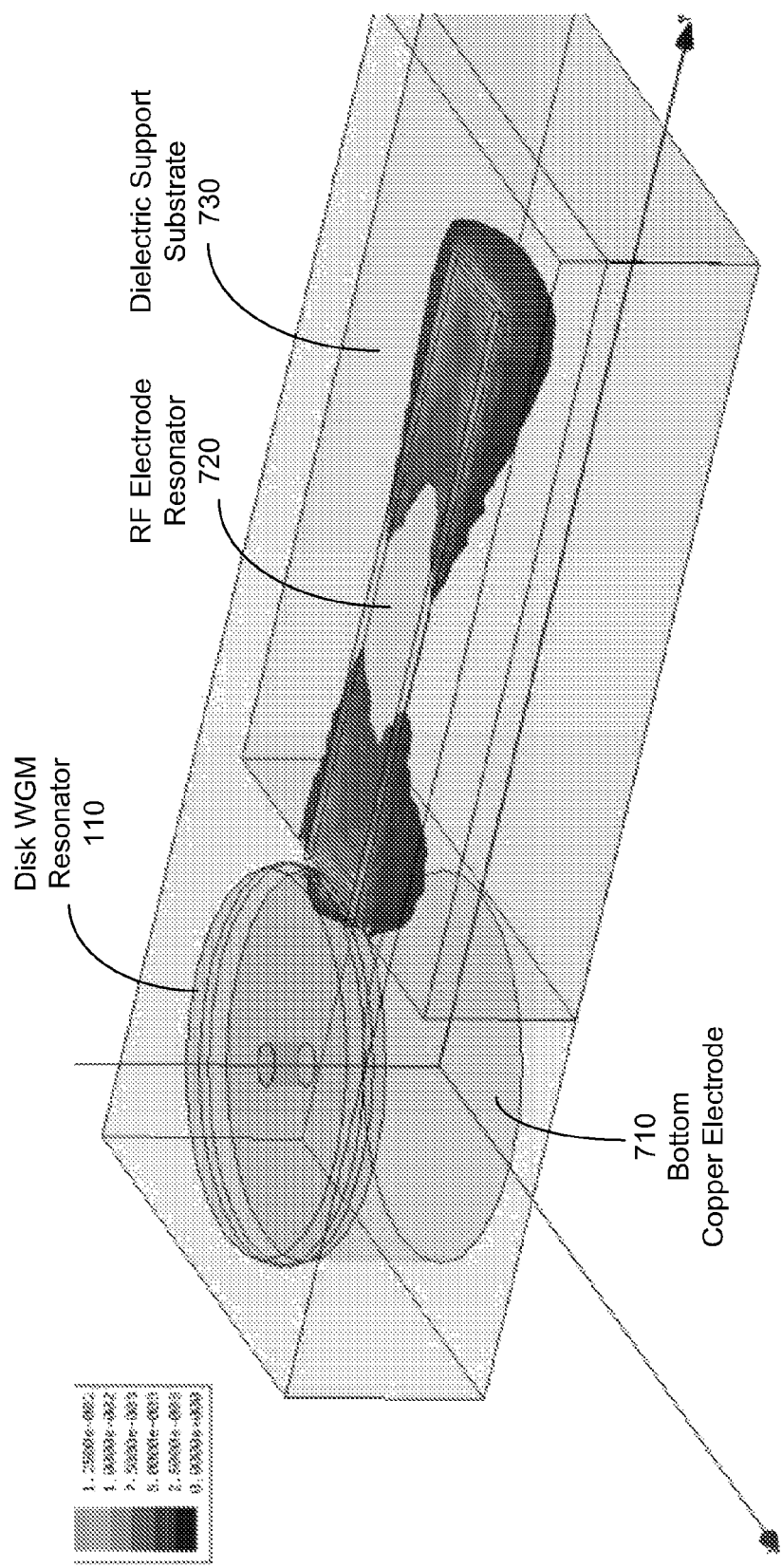

FIGS. 7A, 7B, 7C and 7D show an example of an SSB modulator where the electrode couples an RF signal in a polarization that is in the plane of the optical loop in the WGM resonator equator in which the light is confined. Referring to FIGS. 7A and 7B, this SSB modulator includes a disk WGM resonator 110 made of an electro-optic material, a bottom electrode 710 which can be made of a copper cylindrical post, a top electrode 712, and an RF electrode resonator 720 placed in contact with the exterior surface of the WGM resonator equator. The terminal end of the RF electrode resonator 720 that is in contact with the WGM resonator 110 is separated from the bottom and top electrodes 710 and 712.

Figure 7C:
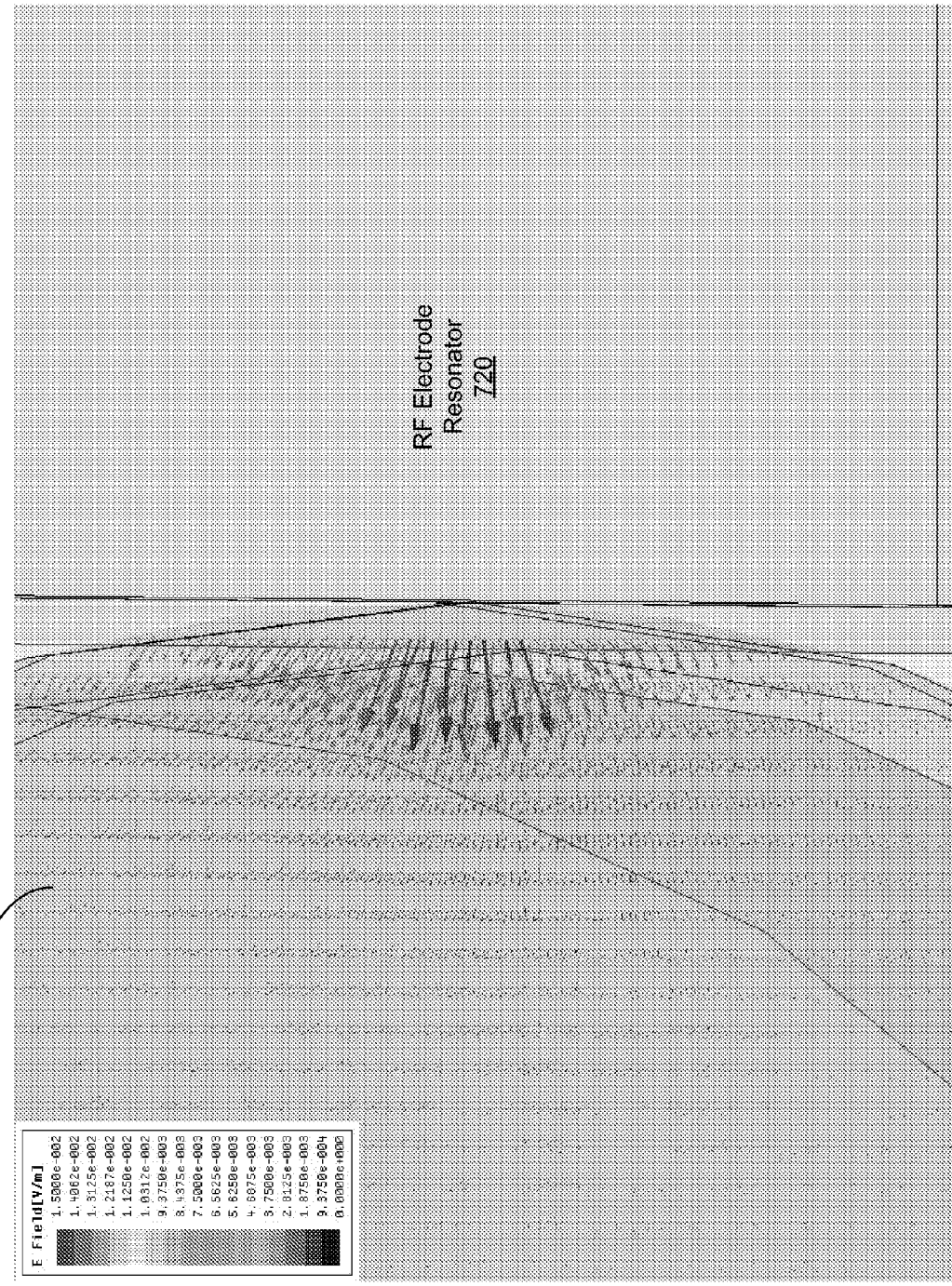

FIGS. 7A and 7B also illustrate the spatial distribution and intensity of the electric field of the RF signal applied by the RF electrode resonator 720. The electric field of the RF signal is shown to concentrate at or near the exterior surface of the WGM resonator equator where the WGM modes are present. This design provides sufficient spatial overlap of the optical WGM modes and the RF signal for efficient electro-optic interaction for the SSB modulation. FIG. 7C further shows the spatial distribution and intensity of the electric field of the RF signal in the plane at or near the WGM resonator equator in which the WGM modes circulate.

Figure 7D:
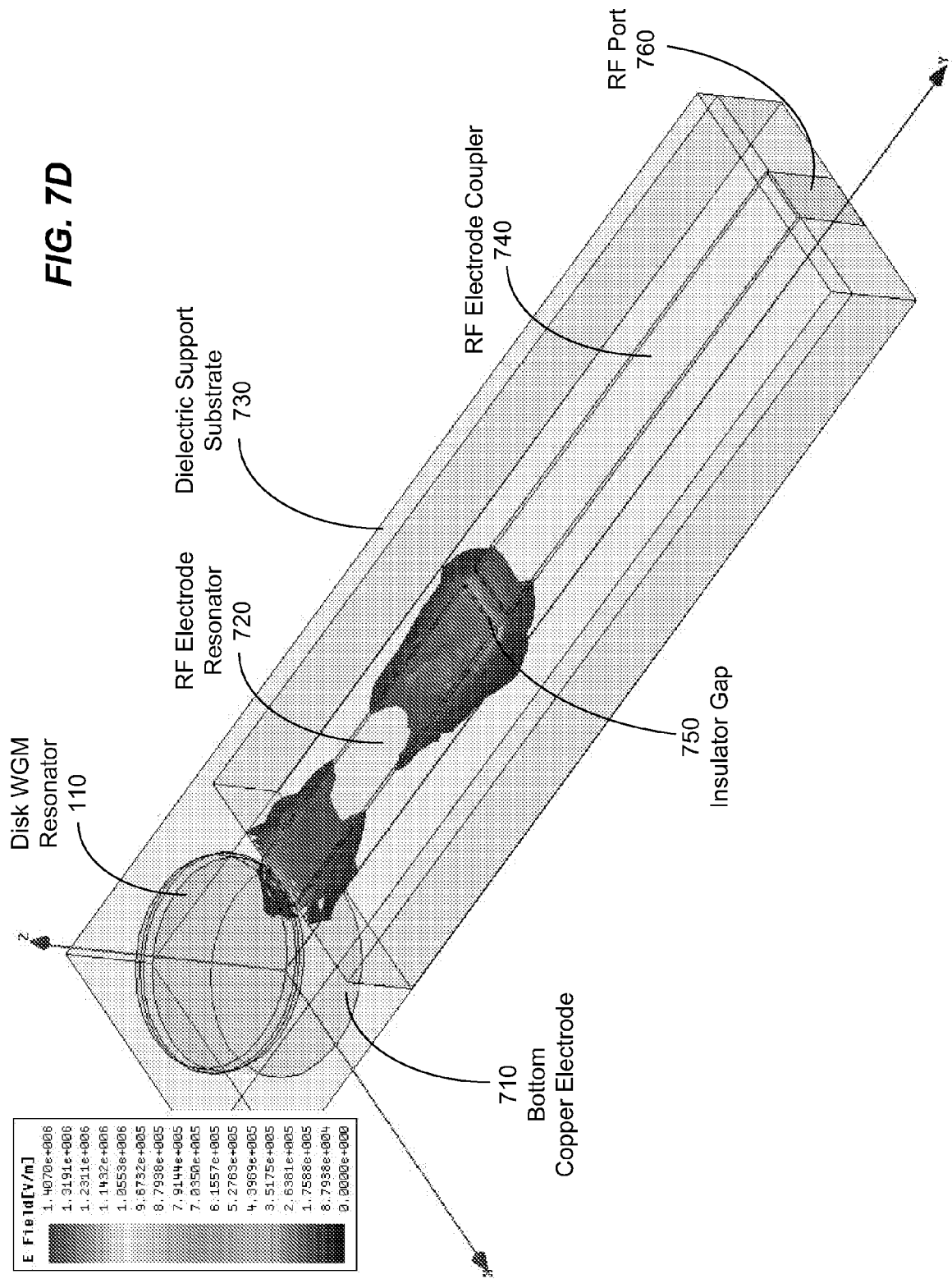

FIG. 7D shows that an RF electrode coupler 740 is electromagnetically coupled to the RF electrode resonator 720 via an insulator gap 750 to direct an RF signal to the RF electrode resonator 720 or to receive an RF signal from the RF electrode resonator 720. The RF electrode coupler 740 can be a metal microstrip with its first end that interfaces with the RF resonator 720 at the gap 750. The second end of the RF electrode coupler 740 is connected an RF port 760 for receiving or outputting the RF signal.

The disk WGM resonator 110 and the RF electrode resonator 720 can be supported by one or more dielectric substrates or materials. For example, a dielectric substrate 730 is shown to support the electrodes 720 and 740 in FIG. 7D.

In the SSB modulator in FIGS. 7A-7D, the modulation frequency depends on the difference of optical frequency between TE and TM optical modes. Natural birefringence of ferroelectrics materials results in a Vernier effect between combs of the fundamental TE modes and fundamental TE modes. The optical frequencies of the fundamental TE and TM modes of whispering gallery mode resonator 110 can be expressed as:

$$f_{TE} = \frac{c}{(n_o \pi D)\left(l + 2.34^3 \sqrt{\frac{l}{2}}\right)}$$

$$f_{TM} = \frac{c}{(n_e \pi D)\left(l + 2.34^3 \sqrt{\frac{l}{2}}\right)}$$

where l is the mode number. The difference between two modes can be calculated and predicted for a given electro-optic material with the ordinary-wave refractive index n0 and the extra-ordinary-wave refractive index ne, the diameter (D) and the optical wavelength.

Figure 8:
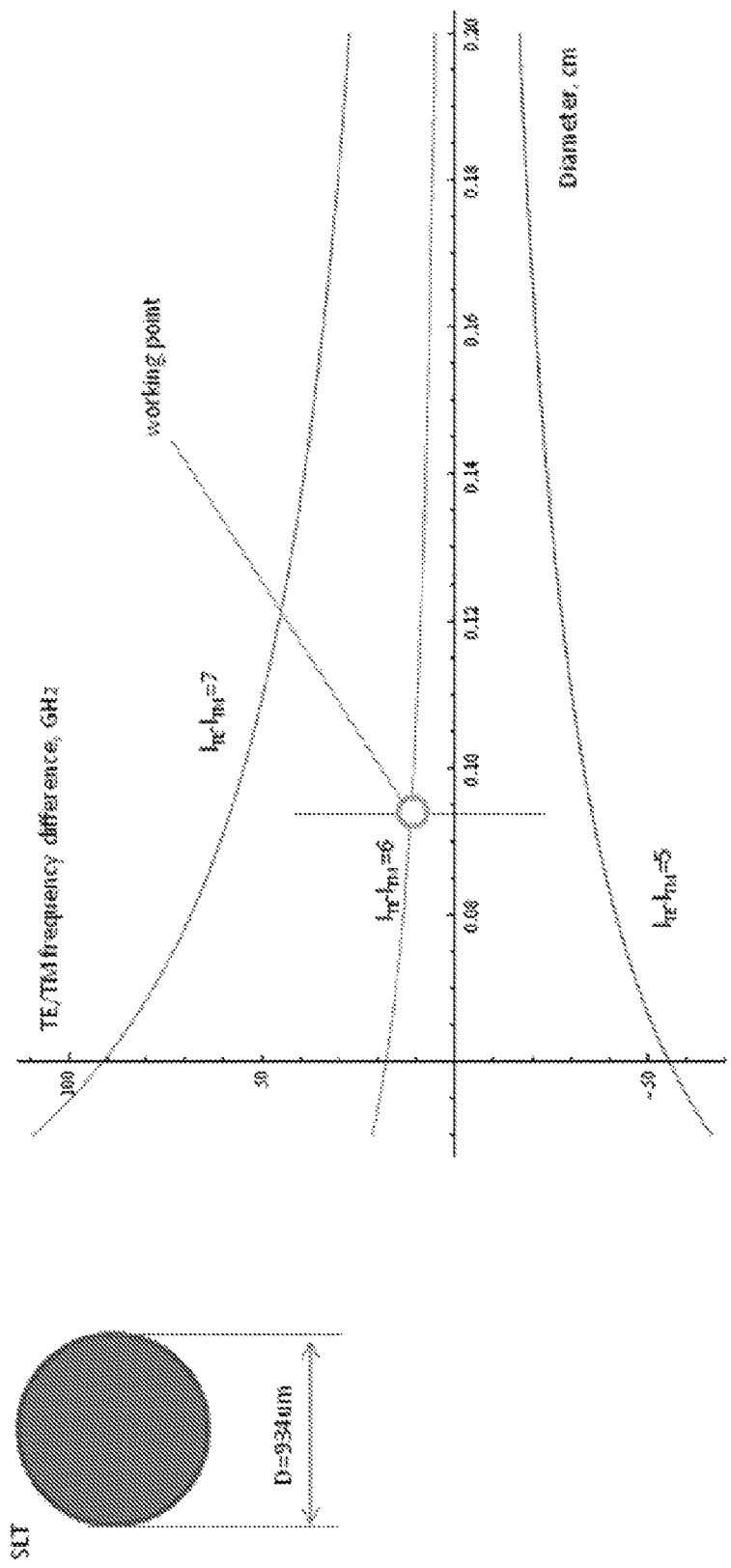
FIG. 8 shows an example for designing a tunable SSB WGM resonator modulator.

WGM resonators fabricated with predetermined diameters have predictable SSB frequencies. FIG. 8 shows the dependence of the modulation frequency of the SSB modulator for three neighboring modes in a SSB modulator as a function of the resonator diameter. The top curve represents a TE mode and a TM mode whose mode numbers differ by 7, the middle curve represents a TE mode and a TM mode whose mode numbers differ by 6 and the bottom curve represents a TE mode and a TM mode whose mode numbers differ by 5. In designing a SSB modulator, the resonator diameter can be selected for a range of the SSB frequencies desired for an application. This SSB frequency can be tuned by a bias voltage applied on the resonator or by using a thermal control or controlled mechanical compression. For example, a 17-GHz tuning band in a LiNbO3 SSB modulator can be achieved by controlling a DC voltage for tuning at a high speed, or via a temperature control at a rate of about 0.8 GHz/K.

The cross-modulation between two different families of WGM modes of different polarizations in the WGM resonator is used to achieve the SSB modulation. In optically transparent ferroelectrics crystals, e.g., lithium niobate and lithium tantalite, electro-optical indexes of ordinary and extraordinary polarization differ significantly. This allows simple and efficient differential detuning of one WGM mode in one polarization from another WGM mode in an orthogonal polarization by a tuning mechanism that tunes both mode frequencies, e.g., adjusting the DC bias voltage. This DC vias voltage can be mixed with an additional microwave field of frequency equal to difference of resonant optical frequencies the modes would interact if the phase is properly matched in a collinear configuration. Phase matching does not happen automatically since refractive indexes of ordinary, extraordinary optical modes and the microwave mode are different. One solution is to exploit specifically undulated electrode which modulates electric field along the rim of the WGM resonator. The frequency of the desired spatial modulation is determined from phase matching conditions:

$$\frac{\omega_2}{c} n_2 - \frac{\omega_1}{c} n_1 \pm \frac{\omega_2 - \omega_1}{c} N_{eff} = \frac{2\pi}{\Delta}$$

To estimate this value, consider the situation where $(\omega_2 - \omega_1)/2\pi$ is close to the FSR of the resonator, $$A = \frac{D}{2\Delta},$$

and $\omega_1$ and $\omega_2$ correspond to the optical frequencies of the two modes.

$$A = \frac{2\pi}{l \frac{n_2 - n_1}{n} + \left(1 \pm \frac{N_{eff}}{n}\right)}$$

where l is the mode number. The phase matching occurs when the disk diameter for a lithium tantalite WGM disk resonator is about 116 μm and the disk diameter for a lithium niobate WGM disk resonator is about 8 μm.

An optical grating written on electrode of the modulator designed for phase matching in tantalate resonators of 400-μm diameter has a period of 138 degrees. For lithium niobate, this value is about 6 degrees. Both gratings can be fabricated with lithography or other techniques. This kind of modulation accepts one polarization of light, and rotates its polarization during modulation in response to an RF or microwave signal.

The electro-optical WGM resonator modulator operates at differential frequencies between optical modes in mutually orthogonal polarizations. In some nonlinear crystals, this difference in frequency can be tuned with the control voltage and the operating temperature. For instance, lithium niobate shows three times different electro-optical index of both polarizations. It was previously demonstrated that fast frequency shift of the resonator made of lithium niobate is as high as 20 GHz per 100V for one and 7 GHz for another. Thus tunability span based on lithium niobate cross-mode modulator is 13 GHz. Hence, the operational frequency of 35 GHz high-efficient receiver can be changed very quickly by voltage through ~30%. On the other hand thermal-operational point can change this differential frequency even further to terahertz range. The SSB modulation used in the present designs eliminates the mode for the second sideband. Lithium tantalate-based modulators tend to have better efficiency of modulation than lithium niobate based modulators since mode overlapping in the Lithium tantalate is much better as a result of very similar refractive indexes of both polarizations.

Therefore, the present SSB modulator designs combine advantages of narrowband high-Q-factor WGMR-based modulator with tunability and can be tuned within the differential detuning range. The tuning range can cover various ranges in applications, e.g., from X band to W band in some implementations.

The above tunable SSB modulator based on an electro-optic WGM resonator can be used to form various photonic, RF and microwave devices and systems. One example is photonic RF and microwave receivers in which a received RF or microwave signal is applied to the electro-optic material of the WGM resonator to perform the SSB modulation so that the baseband signal in the received signal is carried by the optical single sideband in the modulated output light of the resonator. This optical single sideband in the modulated output light of the resonator is detected at an optical receiver to recover the baseband signal. Such receivers are tunable by tuning the SSB modulator.

Another example of an application for the tunable SSB modulator is a tunable opto-electronic oscillator (OEO) based on the SSB modulator. An OEO is based on an electro-optic feedback loop that directly converts light energy to spectrally pure RF radiation. The OEO performance does not degrade with RF frequency, and an OEO operating at, e.g., 5 GHz, has the same noise performance as one operating at 60 GHz, assuming the same amplifier noise for the two examples. This is a useful feature for radio over fiber (RoF) applications.

An opto-electronic oscillator (OEO) is an oscillator with a positive feedback loop that has both electronic and optical components. See, e.g., U.S. Pat. Nos. 5,723,856 to Yao and Maleki and 5,777,778 to Yao, which are incorporated by reference as part of the specification of this document. Such an OEO includes an electrically controllable optical modulator and at least one active opto-electronic feedback loop that comprises an optical part and an electrical part interconnected by a photodetector. The opto-electronic feedback loop receives the modulated optical output from the modulator and converted it into an electrical signal to control the modulator. The loop produces a desired delay and feeds the electrical signal in phase to the modulator to generate and sustain both optical modulation and electrical oscillation at the modulation frequency of the modulator when the total loop gain of the active opto-electronic loop and any other additional feedback loops exceeds the total loss. OEOs use optical modulation to produce oscillations in frequency spectral ranges that are outside the optical spectrum, such as in RF and microwave frequencies. The generated oscillating signals are tunable in frequencies and can have narrow spectral linewidths and low phase noise in comparison with the signals produced by other RF and microwaves oscillators. Notably, the OEOs are optical and electronic hybrid devices and thus can be used in various applications.

The examples of OEOs described in this document use a whispering mode gallery mode resonator made of an electro-optic material as the optical modulator for modulating the CW laser light from a laser, to filter the modulated laser light and to provide at least a part of the optical delay in the feedback loop. The electro-optic material supports two mutually orthogonal polarizations which may be referred to as the original wave and the extra-ordinary wave, or the TM mode and the TE mode. These two different polarized waves undergo a frequency shift with respect to each other in the electro-optic WGM resonator modulator and proper control of the polarization in OEO feedback loop can be used to produce one modulation sideband in the detector output of an optical detector that interconnects the electrical portion and the optical portion of the feedback loop. Therefore, a single sideband (SSB) modulation can be achieved in the OEO and provides a flexible operating frequency range that is not limited by the FSR of the WGM resonator.

Figure 9:
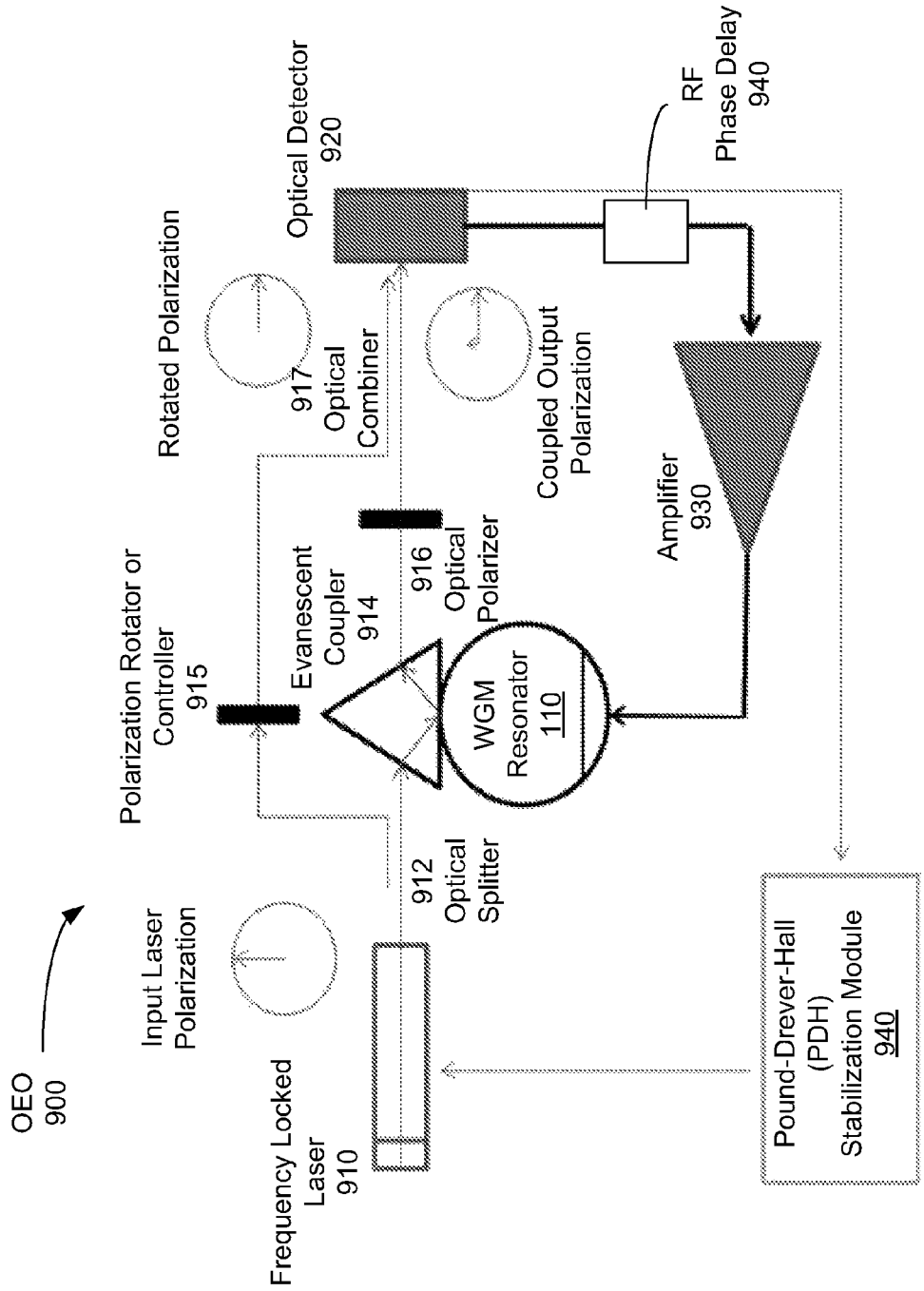
FIGS. 9 and 10 show examples of opto-electronic oscillators based on tunable SSB WGM resonator modulators.
Figure 10:
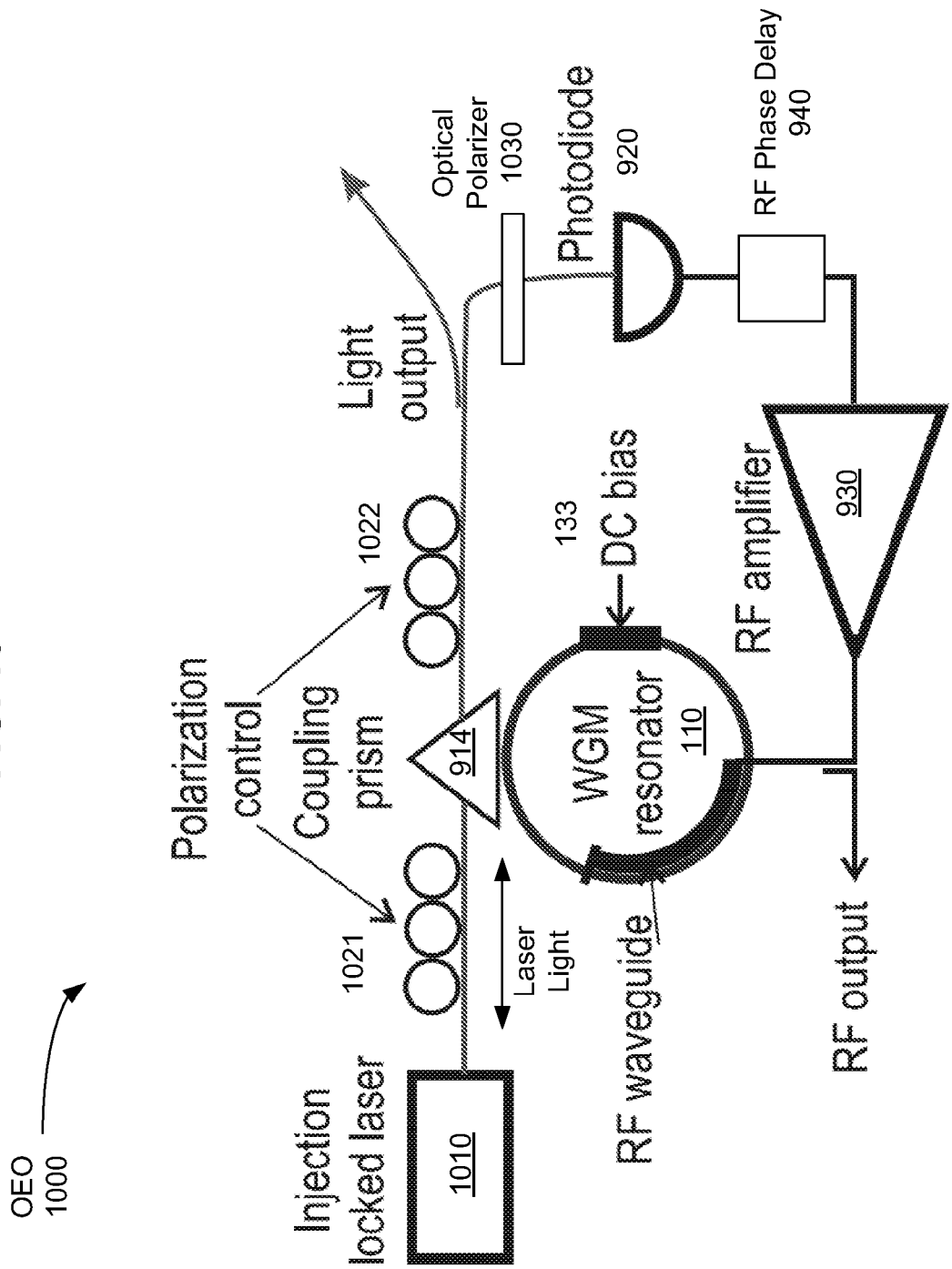

FIGS. 9 and 10 show two OEO examples that use tunable SSB modulation with a compressed carrier (i.e. frequency shifter) to provide a tunable OEO operation.

FIG. 9 shows the first example 900 of an OEO based on the cross modulation between two polarization modes in the WGM resonator. This OEO 900 includes a tunable laser 910 that produces a CW laser beam for the OEO 900, an WGM resonator modulator based on the design in FIGS. 1A and 1B with an electro-optic WGM resonator 110, an evanescent coupler 914 for coupling light into the WGM resonator 110 for optical modulation, delay and filtering and coupling modulated light out of the WGM resonator 110, and an optical detector 920 for interfacing the optical and electrical portions of the OEO feedback loop. An optional amplifier 930 may be coupled in the electrical portion of the OEO loop to amplify the output signal from the detector 920. A phase delay control module can be implemented in the OEO loop to adjust the phase delay of the loop for tuning the OEO. For example, an RF phase delay 940 can be inserted in the electrical portion of the OEO loop to provide this phase delay adjustment. A variable optical delay element can also be inserted into the optical portion of the OEO loop to provide this control. A combination of the optical delay control and the RF delay control may be implemented.

The laser 910 is linearly polarized and is split into two laser beams along two optical paths by an optical splitter 912 located between the laser 910 and the evanescent coupler 914. The first optical path includes a polarization rotator or a polarization controller 915 which rotates the optical polarization of the first laser beam that is not modulated by 90 degrees. The second optical path leads to the evanescent coupler 914 and the WGM resonator modulator, and an optical polarizer 914 that transmits light in a polarization orthogonal to the input laser polarization and rejects light in the input laser polarization. An optical combiner 917 is provided to combine light in the first and second optical paths to produce a combined output beam to the optical detector 920. The beat between the two beams at the combiner 916 is detected by the detector 920 and is converted to a single sideband (SSB) signal.

The opto-electronic loop of the OEO 900 in FIG. 9 has an optical portion formed by the WGM resonator 110 as an optical delay element, an optical filter and an optical modulator, and an electrical portion which includes the optical detector 920 (e.g., a photodiode), and the electrical feedback path to the electrodes on the resonator 110 (including the amplifier 930). This is a closed loop and can be operated to have a loop gain higher than the loop loss and the feedback to the resonator 110 can be in phase. Under such conditions, the closed loop is a positive feedback loop and will oscillate as an opto-electronic oscillator (OEO) at a frequency at which the light in the resonator 110 is modulated.

The tunable laser 910 is locked in frequency to the mode of the modulator 110 in one of the two orthogonal polarizations, e.g., the extraordinary polarization. This laser locking can be achieved by various techniques. In one example, which is shown in FIG. 9, a Pound-Drever-Hall (PDH) stabilization module 940 is used to lock the laser 910. Various PDH stabilization implementations are known. In another example, an injection locking based on an optical feedback from the resonator 110 is used without the PDM stabilization module 940. The laser 910 (e.g., a diode laser) can be optically coupled to the WGM resonator 110 via the evanescent coupler 914 that couples light out of the resonator 110 back to the laser 910. This feedback light of the resonator 110 is injected back to the laser 910 to stabilize the laser 910 so that the laser wavelength is locked at the wavelength of the WGM mode in the resonator 110 and to reduce the linewidth of the laser 910. One way to achieve this injection locking is described in U.S. patent application Ser. No. 12/139,449 entitled "TUNABLE LASERS LOCKED TO WHISPERING GALLERY MODE RESONATORS" and filed on Jun. 13, 2008, which is incorporated by reference as part of the specification of this application.

The WGM resonator 110 supports two WGM polarization modes: the ordinary wave and the extra-ordinary wave. The evanescent coupler 914 (e.g., a prism coupler) can optically couple light in both modes. The optical polarizer 916 can be oriented to select one of the modulated light in the two modes for the optical detection and conversion at the optical detector 920. As an example, the optical polarizer 916 can be used to suppress the ordinary emission in the output allowing only the signal of the extra-ordinary wave to be directed to the optical detector. Output of extraordinary polarization is mixed coherently by aligning polarization in the other optical path with small portion of initial laser's power to produce AM microwave signal at detector 920. The detector output is fed back to the modulator 110. In this scheme oscillations of a fixed frequency at FSR of extraordinary polarization are suppressed because of polarized output and the OEO oscillator operates at the tunable differential ordinary-extraordinary frequency.

Various polarization selective elements for output coupling may be implemented for the OEO 900 in FIG. 9. For example, a prism-based output coupler with a polarizer can be used as shown in FIG. 9. In another example, a probe prism of a high refractive index (e.g., a Ge prism) can be used and, due to boundary conditions, this prism couples out extraordinary polarization more efficiently than ordinary one. As a result in OEO pumped with ordinary polarization oscillations at fixed FSR can be suppressed. In yet another example, an optical detector can be attached to the rim of the resonator 110 through a transparent spacer. The ordinary polarization has an index (n2) higher than that of the evanescent field which allows simple and compact suppression of the fixed frequency oscillation.

Hence, based on the above example, it is possible to achieve multiple functions in a tunable OEO: optical modulation of light, optical filtering, optical delay and optical tuning of the frequency, with a single WGM resonator made with an electro-optic crystal. WGM resonators are axio-symmetric dielectric structures that support modes with very high quality factors (e.g., $2 \times 10^9$). Such WGM resonators can be configured so that sidebands on the optical carrier at the RF frequency are generated at the output when an optical mode is excited with the pump laser light and a RF signal with a frequency corresponding to the free spectral range (FSR) of the resonator are simultaneously applied. This scheme is used to realize an efficient EOM. Such a modulator can improve the OEO properties. An efficient OEO calls for the intrinsically amplitude modulation. The WGM-based electro-optic modulation (EOM) scheme by constructing a structure that produces single sideband modulation (SSB). Such a modulation has an amplitude counterpart. This can be accomplished by applying the RF field along the radius of a WGM resonator produced from a Zcut lithium niobate preform. Such an RF field couples optical TE and TM mode families of the WGM resonator due to the non-diagonal element $r_{51}$ of the electro-optic tensor of the material. Because the TE and TM mode families are frequency shifted with respect to each other, only one modulation sideband is generated. By applying a DC voltage to the WGM resonator the modes belonging to different mode families move in frequency, but at different rates. Thus, the mode spacing, and the corresponding modulation frequency given by the mode spacing, can be tuned. This configuration leads to a highly efficient, tunable, narrowband modulator, the three parameters that allow realization of a high performance, tunable OEO.

FIG. 10 shows another CEO example 1000 based on the above cross modulation of two polarization modes in the WGM resonator 110. The semiconductor laser 210 is injection locked to the lithium niobate or tantalate resonator 110 arranged as a SSB modulator. The output of the modulator 110 may be sent to a semiconductor optical amplifier (SOA) before entering a long length of fiber that is directs light to the optical detector 920. The optical detector 920 produces an electric signal that is amplified before being fed back to the modulator 110 to complete the OEO loop. The narrow bandwidth of the resonator 110 provides the filter function for the loop, and the change in the mode spacing produced by the applied DC voltage bias tunes the frequency. Such an oscillator may be tuned from 20 to 35 GHz. The spectral purity goal corresponds to the phase noise of −120 dBc at 100 kHz.

Different from the two optical path design in the CEO 900 shown in FIG. 9, the CEO 1000 in FIG. 10 implements two polarization controllers 1021 and 1022 to achieve the cross modulation of the two polarization modes in the resonator 110. The first polarization controller 1021 is placed in the optical path (e.g., the fiber) between the laser 1010 and the evanescent coupler 914 to place the polarization of the laser light at 45 degrees with respect to either one of the two orthogonal polarizations in the resonator 110. Under this input polarization configuration, one half of the input laser light is coupled into the WGM resonator and the remaining one half is reflected, without entering into the resonator 110, to pass through the evanescent prism coupler 914 into the output optical path to the optical detector 920. The one half of the laser light coupled into the resonator 110 is modulated and filtered and is then coupled out by the coupler 914 to overlap with the reflected laser input light. The combined light is then directed into the detector 920.

Notably, the SSB modulator operates based on coupling of TE and TM modes and the SSB signal is orthogonally polarized to the pump light that is used to pump the WGM resonator 110. An optical polarizer 1030 can be inserted in front of the detector 920 to reject the light at the optical carrier frequency of the pump light and to transmit light in the orthogonal polarization which is the SSB signal. This polarization-selective detection can increase the signal suppression of the OEO and improves the stability and performance of the OEO.

Based on above, in one aspect, an OEO can be constructed to include a laser that is tunable and produces a laser beam at a laser frequency; an optical resonator exhibiting an electro-optic effect and structured to support whispering gallery modes circulating in the optical resonator in two mutually orthogonal polarizations and being optically coupled to the laser to receive a portion of the laser beam into the optical resonator; a laser locking mechanism to lock the laser frequency with respect to a whispering gallery mode resonance of the optical resonator; an evanescent optical coupler that evanescently couples the laser beam into the optical resonator and evanescently couples the light inside the optical resonator out of the optical resonator to produce resonator output light; electrodes formed on the optical resonator to apply a modulation control signal to effectuate an optical modulation of light based on the electro-optic effect; an optical detector to receive a portion of light from the laser that does not enter the optical resonator and at least a portion of the resonator output light; a polarization control mechanism to control polarizations of the portion of light from the laser that does not enter the optical resonator and the portion of the resonator output light to allow light in the two mutually orthogonal polarizations to interfere at the optical detector to produce a single modulation sideband corresponding to one of the two mutually orthogonal polarizations; and a feedback circuit coupled between the optical detector and the electrodes to receive a detector output from the optical detector and to produce the modulation control signal at a tunable modulation frequency.

In another aspect, an OEO can include a laser that is tunable and produces a laser beam at a laser frequency; and an electrically controllable optical modulator to receive the laser beam and to modulate the laser beam to produce a modulated laser beam. The optical modulator includes an optical resonator exhibiting an electro-optic effect and structured to support whispering gallery modes circulating in the optical resonator in two mutually orthogonal polarizations and being optically coupled to the laser to receive a portion of the laser beam into the optical resonator, and electrodes formed on the optical resonator to apply a modulation control signal to effectuate an optical modulation of light based on the electro-optic effect. This photonic device also includes an active opto-electronic feedback loop that comprises an optical part coupled to the optical resonator to receive the modulated laser beam and an electrical part that produces the modulation control signal, and an optical detector coupled between the optical part and the electrical part and the opto-electronic feedback loop feeds the modulation control signal in phase to the electrodes on the optical resonator to generate and sustain both optical modulation and electrical oscillation at the modulation frequency of the modulator. A polarization control mechanism is provided in this photonic device to control polarization of light received at the optical detector to allow light in the two mutually orthogonal polarizations to interfere at the optical detector to produce a single modulation sideband so that a modulation frequency of the modulator at a difference between frequencies of whispering gallery modes at the two mutually orthogonal polarizations inside the optical resonator.

In addition, a method is provided for operating an electro-opto oscillator having an electrically controllable optical modulator comprising an optical resonator exhibiting an electro-optic effect and structured to support whispering gallery modes circulating in the optical resonator in two mutually orthogonal polarizations. This method includes providing an active opto-electronic feedback loop that comprises an optical part coupled to the optical resonator to receive a modulated laser beam from the optical modulator and an electrical part that produces the modulation control signal, and an optical detector coupled between the optical part and the electrical part; operating the opto-electronic feedback loop to feed the modulation control signal in phase to electrodes on the optical resonator to generate and sustain both optical modulation and electrical oscillation at a modulation frequency of the modulator; and controlling polarization of light received at the optical detector to obtain a single modulation sideband in the output of the optical detector to set the modulation frequency of the modulator at a difference between frequencies of whispering gallery modes at the two mutually orthogonal polarizations inside the optical resonator.

One of various uses of OEOs is generation of a reference oscillation frequency. For example, U.S. Pat. No. 6,762,869 to Maleki entitled "Atomic clock based on an opto-electronic oscillator" discloses examples of atomic clocks based on OEOs.

SSB-based OEOs can be used in connection with an atomic frequency reference, e.g., a known atomic transition, to generate atomic clock signals. We show that usage of a single sideband (SSB) electro-optical modulator (EOM) based on a whispering gallery mode (WGM) results in a significant improvement of properties of both active and passive optical clocks and magnetometers based on the effect of coherent population trapping (CPT) for transitions of three atomic levels, e.g., an inverse V shaped three levels. The examples of atomic clocks described below operate based on (1) the single sideband electro-optical modulator generates optical sideband polarized orthogonally with respect to the optical pump polarization and (2) locking of the carrier-sideband optical pair to the atomic transition automatically stabilizes entire WGM spectrum.

The effect of CPT allows interrogating atomic clock transitions without a microwave resonator, which makes possible fabrication of compact atomic clocks and magnetometers. The effect of CPT usually suffers from the smaller signal contrast resulting from the optical pumping. The SSB EOM creates a modulation sideband with the polarization orthogonal to the polarization of the incoming optical pumping. Hence, the SSB EOM significantly simplifies the realization of the high contrast CPT resonances and also is promising in the optical clock/magnetometer applications.

Figure 11:
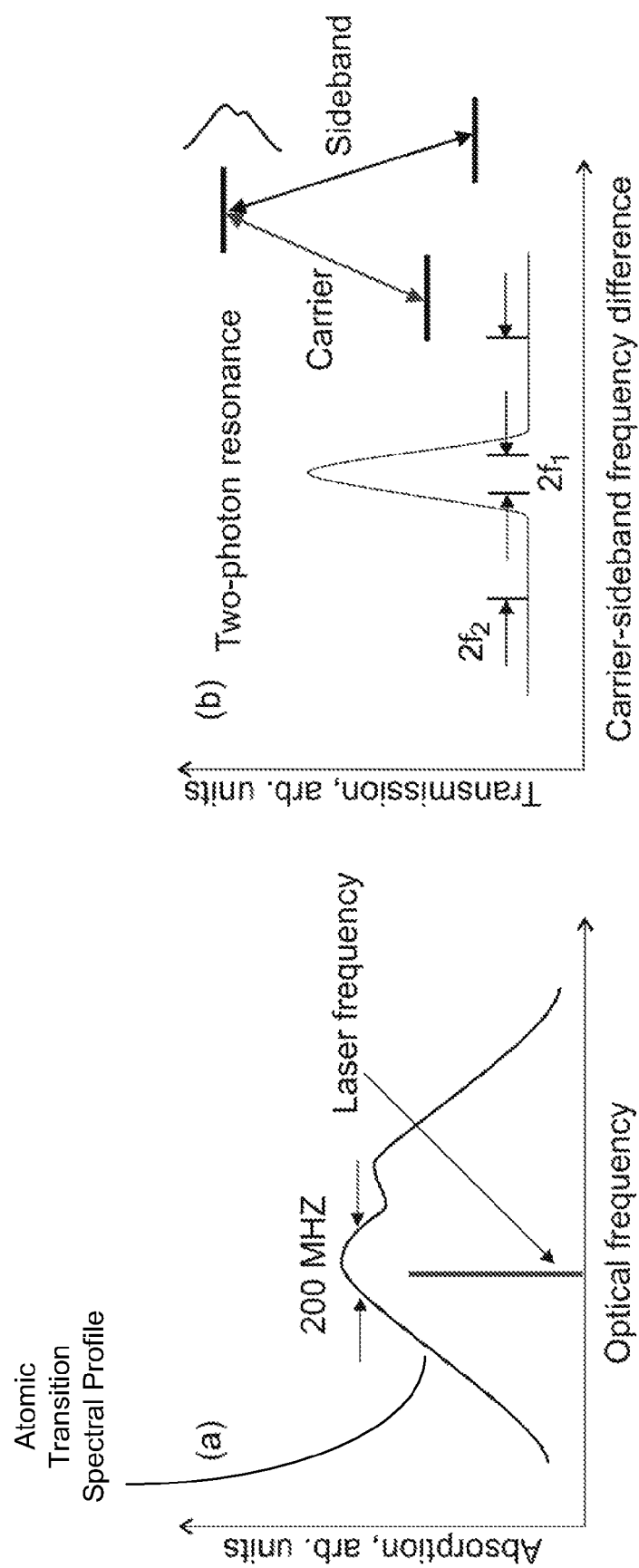
FIGS. 11, 12, 13 and 14 show examples of atomic clocks based on tunable SSB WGM resonator modulators and their operations.

In general, the WGM resonance of the WGM resonator in the present SSB modulator is locked to a selected atomic transition to produce the desired atomic clock signal, e.g., an atomic hyperfine transition. FIG. 11 illustrates the locking mechanism and an exemplary 3-level atomic structure for the two-photon CPT effect.

The locking can be achieved by slow modulation of the TE-TM frequency difference in the vicinity of the CPT resonance of the selected atomic transition, e.g., a transition of an atomic vapor stored in an atomic vapor cell. The frequency of the laser, and the frequency of the mode the laser is locked to, should be within the spectral width of the optical atomic transition used for the locking (FIG. 11($a$)). For instance, the optical frequency may be within 200-300 MHz of the Rb87 transition if this Rb vapor is utilized as the. atomic reference. The optical frequency can be adjusted by a DC bias applied to the WGM resonator. The resonator should possess such a morphology that the optical WGM mode that the laser is locked to is not influenced by the DC field applied along the resonator symmetry axis (e.g., a z-cut electro-optic crystal structure).

The locking operates as follows. The light propagates through the atomic cell only when the high frequency SSB modulation sideband is resonant with the two-photon atomic transition when the laser frequency is initially parked at the one-photon atomic transition. A slow modulated electric signal at a modulation frequency f1 is applied to the WGM resonator and the modulation frequency f1 is set to be less than the spectral width of the two photon resonance of the atomic transition, so the resultant sidebands are imposed over the optical carrier and the high frequency optical sideband can transmit through the atomic cell. This is illustrated in FIG. 11(b).

Figure 12:
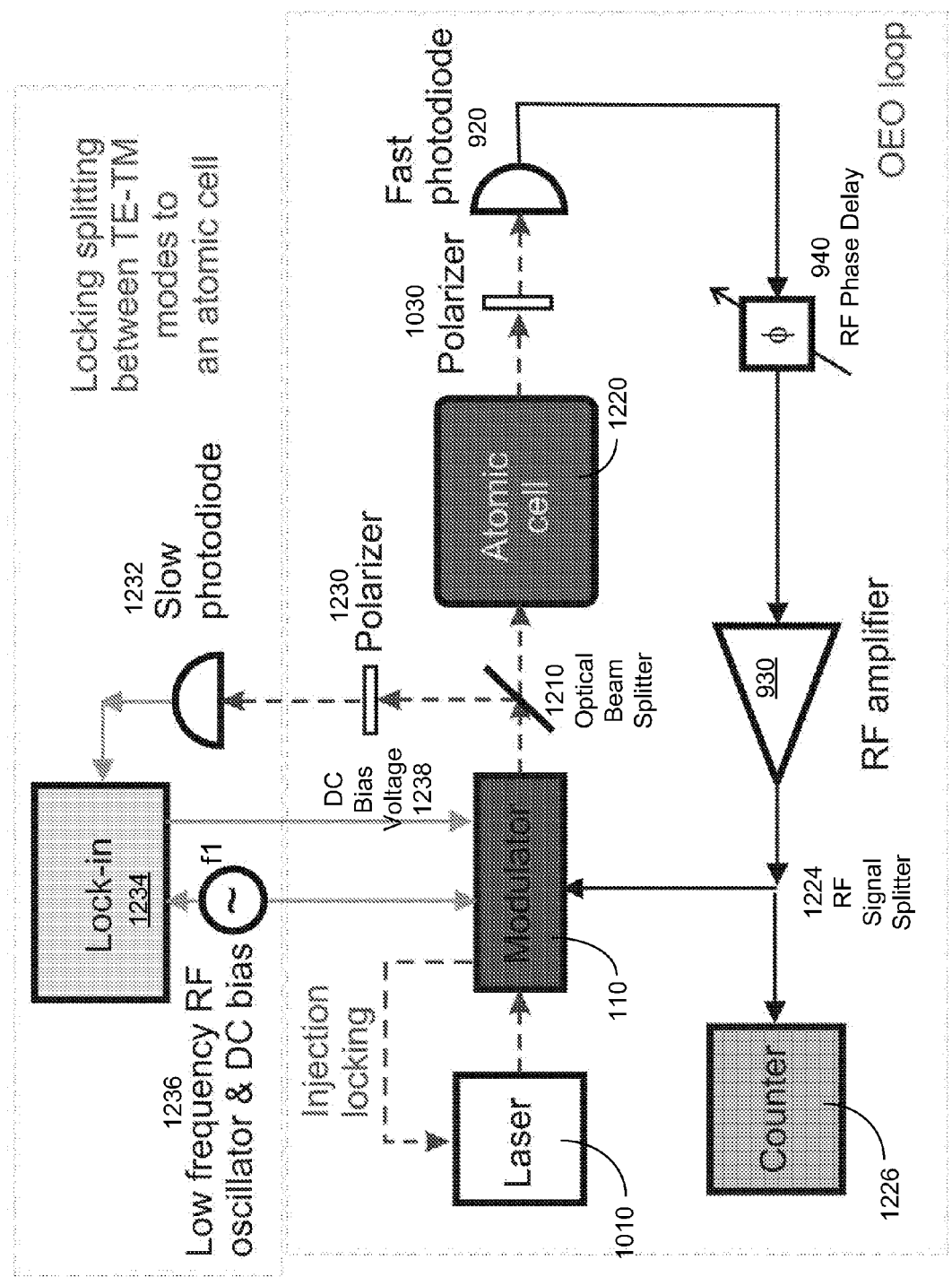

FIG. 12 shows a device that generates an atomic clock signal based on the SSB modulation and OEO operation. This device is based on the OEO shown in FIG. 10 where an atomic reference 1220, e.g., an atomic vapor cell with atoms of the desired atomic transition as the atomic reference, is inserted in the optical path of the OEO loop so that the optical transmission of the atomic reference 1220 is directed to the optical detector 920 of the CEO loop. An optical beam splitter 1210 is placed in the optical output of the SSB modulator 110 to split the optical output with SSB into a first optical beam and a second optical beam. The first optical beam is directed to the atomic reference 1220 in the OEO loop and the second optical beam is directed to a locking module that locks the SSB sideband to the atomic transition of the atomic reference 1220. In the optical path of the second optical beam from the beam splitter 1210, an optical polarizer 1230 is provided to transmit the SSB signal while reject light at the optical carrier frequency of the pump laser generated by the laser 1010. A slow photodiode 1232 is provided to detect the optical transmission of the polarizer 1230. The output of the detector 1232 is sent into a lock-in amplifier 1234. A low frequency RF oscillator 1236 is provided to generate the modulation frequency f1 which is applied to the WGM resonator 110 for SSB modulation where the modulation frequency f1 is set to be less than the spectral width of the two photon resonance of the atomic transition in the atomic reference 1220. A DC bias voltage 1238 is generated from the Lock-in amplifier 1234 and is applied to the WGM resonator 110. An RF signal splitter 1224 is provided to split a portion of the RF signal applied to the WGM resonator 110 for OEO locking to a counter circuit 1226.

The device in FIG. 12 includes three locking loops: (i) injection locking of the laser 1010 to the WGM resonator 110, (ii) locking of the frequency difference between TM and TE optical modes of the WGM resonator 110, and (iii) locking of the WGM resonator 110 to the atomic cell 1220 via the OEO loop based on the CPT effect.

Injection locking of the laser 110 to the optical WGM resonator 110 forces the laser frequency to follow the frequency of the selected optical mode of the WGM resonator 110. This lock is fast (e.g., several microsecond switching time) and ultimately leads to reduction of the laser radiation linewidth as well as power noise. For example, the linewidth of the injection locked laser can be less than 1 kHz in some implementations, and such narrow laser linewidth can significantly reduce the influence of the laser frequency noise on the clock performance.

In the active (OEO) clock configuration in FIG. 12, the change of WGM resonator temperature results in suppression of the oscillations in the OEO loop because the SSB modulation sideband goes out of the two photon resonance, hence the atomic cell introduces significant loss to the circulating RF signal. The required temperature stability corresponds to a relative TM-TE frequency shift on the order of the FWHM of the $S_{21}$ of the EOM or less (e.g, less than 20 MHz), which can be hardly attainable with a thermal stabilization technique. Hence, an active locking of the TE-TM doublet to the atomic clock transition is an effective way for achieve thermal stabilization.

In the device in FIG. 12, the oscillation frequency of the OEO is given by $$\omega_{OEO} = \omega_{CPT} \frac{\gamma_{S21}}{\gamma_{S21} + \gamma_{CPT}} + \omega_{S21} \frac{\gamma_{CPT}}{\gamma_{S21} + \gamma_{CPT}}.$$

Hence, the oscillation occurs at the frequency of the atomic transition even though this frequency does not coincide with the TE-TM mode frequency difference (the maximum of the $S_{21}$ of the modulator).

Figure 13:
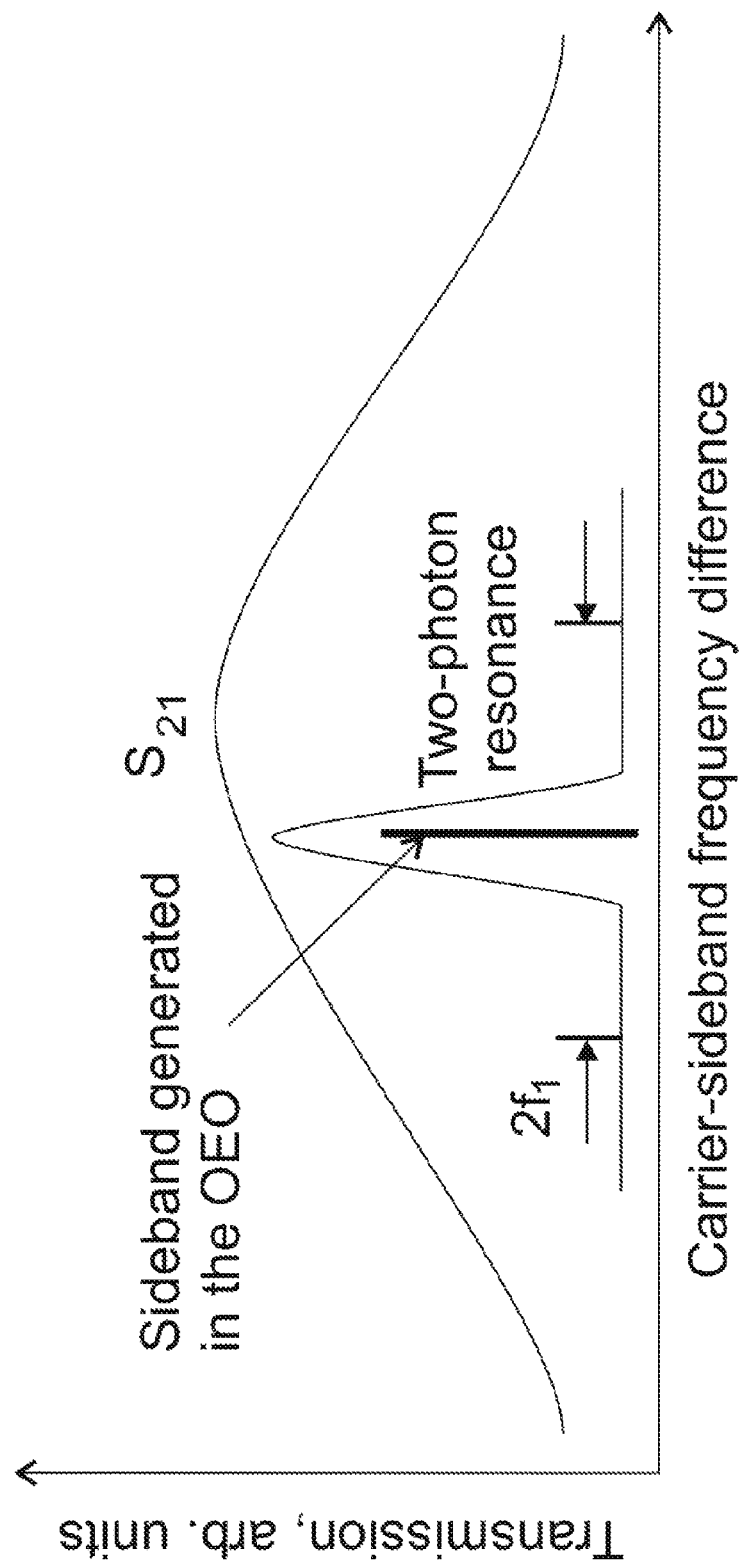

FIG. 13 shows the frequency of the SSB sideband generated in the OEO in FIG. 12 which has a linewidth of that of the narrow atomic transition. Phase modulation is performed on the light at the slow RF frequency $f_1$ such that the modulation sidebands do not pass the atomic cell 1220. This operation generates the error signal using the dispersion of the optical modes of the modulator 110. The error signal is zero only in the case of coincidence of $S_{21}$ of the modulator 110 and the atomic CPT resonance of the atomic reference 1220. This mechanism basically locks the RF frequency of the operating OEO to the atomic transition of the atomic reference 1220. The laser frequency stabilizes as soon as $S_{21}$ is locked.

Figure 14:
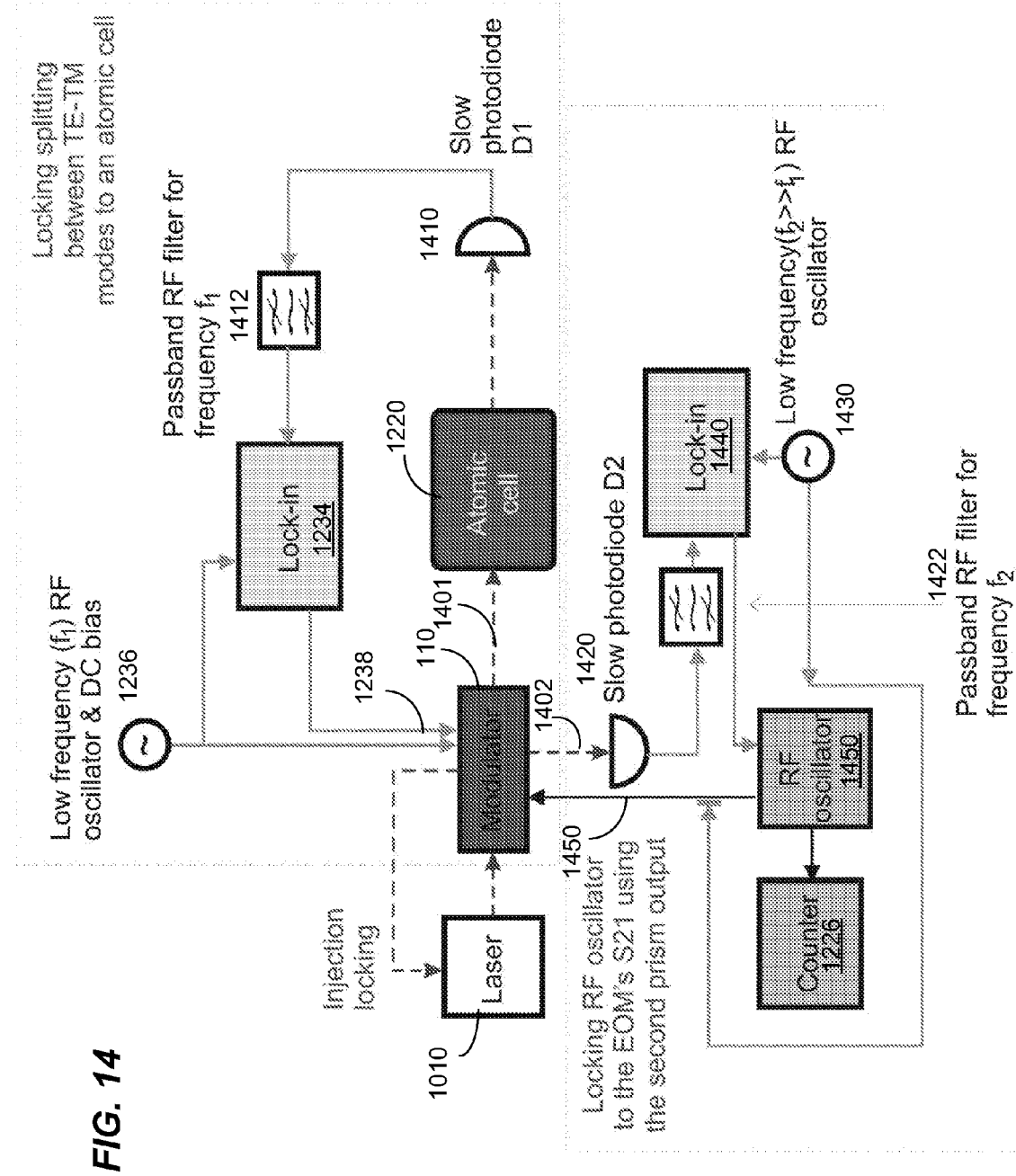

FIG. 14 shows a SSB-based device that provides a passive clock without an OEO. Two optical outputs 1401 and 1402 carrying the SSB from the WGM resonator 110 are generated and can be achieved by splitting an output from the optical coupler of the WGM resonator 110 or directly using two outputs from the optical coupler of the WGM resonator 110. In addition, as illustrated in FIG. 14, a second optical coupler, e.g., a prism, may be used to generate the second optical output 1402.

The first optical output 1401 is directed through the atomic reference 1220 to a first slow optical detector 1410 (D1) and a first passband RF filter for the frequency f1 is provided to receive the detector output from the detector 1410. The output signal of the RF filter 1412 at f1 is directed to the lock-in amplifier 1234. The second optical output 1402 is directed to a second slow optical detector 1420 (D2). A second passband RF filter 1422 for a second RF frequency f2 which is greater than f1 is provided to receive the detector output from the second detector 1402. The output signal of the RF filter 1422 at f2 is directed to a second lock-in amplifier 1440. A second low RF frequency oscillator 1430 is provided to generate the RF signal at f2. An external RF oscillator 1450 is provided to generate an RF control signal and is coupled to the second lock-in amplifier 1440 to receive an output from the lock-in amplifier 1440. The output of the RF oscillator 1450 and the RF oscillator signal from the oscillator 1430 are mixed to produce an RF modulator control signal 1450 that is applied to the RF port of the WGM resonator 110. Hence, the WGM resonator 110 in FIG. 14 receives an RF signal at f1 from the oscillator 1236, the RF modulator control signal 1450 and the DC bias signal 1238 from the lock-in amplifier 1234.

The device in FIG. 14 also includes three locking loops: (i) injection locking of the laser 1010 to the WGM resonator 110, (ii) locking of the external RF oscillator 1450 to the frequency difference between TM and TE optical modes of the WGM resonator 110, and (iii) locking of the WGM resonator 110 to the atomic cell 1220.

The external RF oscillator 1450 is locked to the TE-TM mode transition. The RF oscillator 1450 is provided to operate in the vicinity of the clock transition of the atomic reference 1220. The oscillator 1450 is tunable to allow frequency locking. The oscillator frequency located in the vicinity of the frequency of the atomic hyperfine transition is slowly modulated with frequency f2 generated by the RF oscillator 1430. The frequency value exceeds significantly the spectral width of the two-photon atomic resonance, so the modulation sidebands do not go through the atomic cell 1220 while being able to transmit through the WGM resonator 110. The modulation is of phase type. After passing the resonator 110, the modulation becomes partially amplitude if the frequency of the external RF oscillator 1450 is different from the frequency difference between TE and TM modes of the WGM resonator 110. This basically creates an error signal that allows locking the RF oscillator 1450 to the resonator 110.

The slow electro-optic modulation of the resonator 110 results in phase modulation of both the carrier and the SSB sideband. While passing through the CPT resonance of the atomic reference 1220, the modulation acquires an amplitude admixture if the modulation frequency is detuned from the two photon resonance. The feedback control to the WGM resonator 110 via the lock-in amplifier 1234 locks the TE-TM mode difference to the two-photon transition. Interestingly, the same locking also locks the optical frequency of the carrier at the given point of the optical transition. The entire spectrum of the resonator 110 becomes stable. This is one of the advantages over some other all-optical clocks where the laser frequency is locked to the optical transition using additional locking loop. Tuning of the relative power of the carrier and sideband will allow minimizing the AC Stark shift, which is great advantage of the current scheme.

The above described single sideband (SSB) oscillator can be used to construct tunable microwave or RF receivers. The output of the SSB oscillator can be modulated by an optical modulator such as an electro-absorption modulator (EAM) or an electro-optic modulator (EOM) in response to an RF or microwave input signal. A narrow band optical filter can be used to filter the optical output of the optical modulator to select a desired signal band for optical to electrical conversion that produces the received RF signal. The combination of the SSB oscillator and the narrow optical filtering can provide good image rejection (e.g., greater than 70 dB) while maintaining the advantages of photonic receiver such as its wideband tunability, fast tuning time, small size and low power consumption. In addition, a narrow band high order microwave filter centered at the IF frequency can be used to filter the received RF signal to reduce excess noise of the photonic link and hence increase the sensitivity of the photonic receiver.

Figure 15:
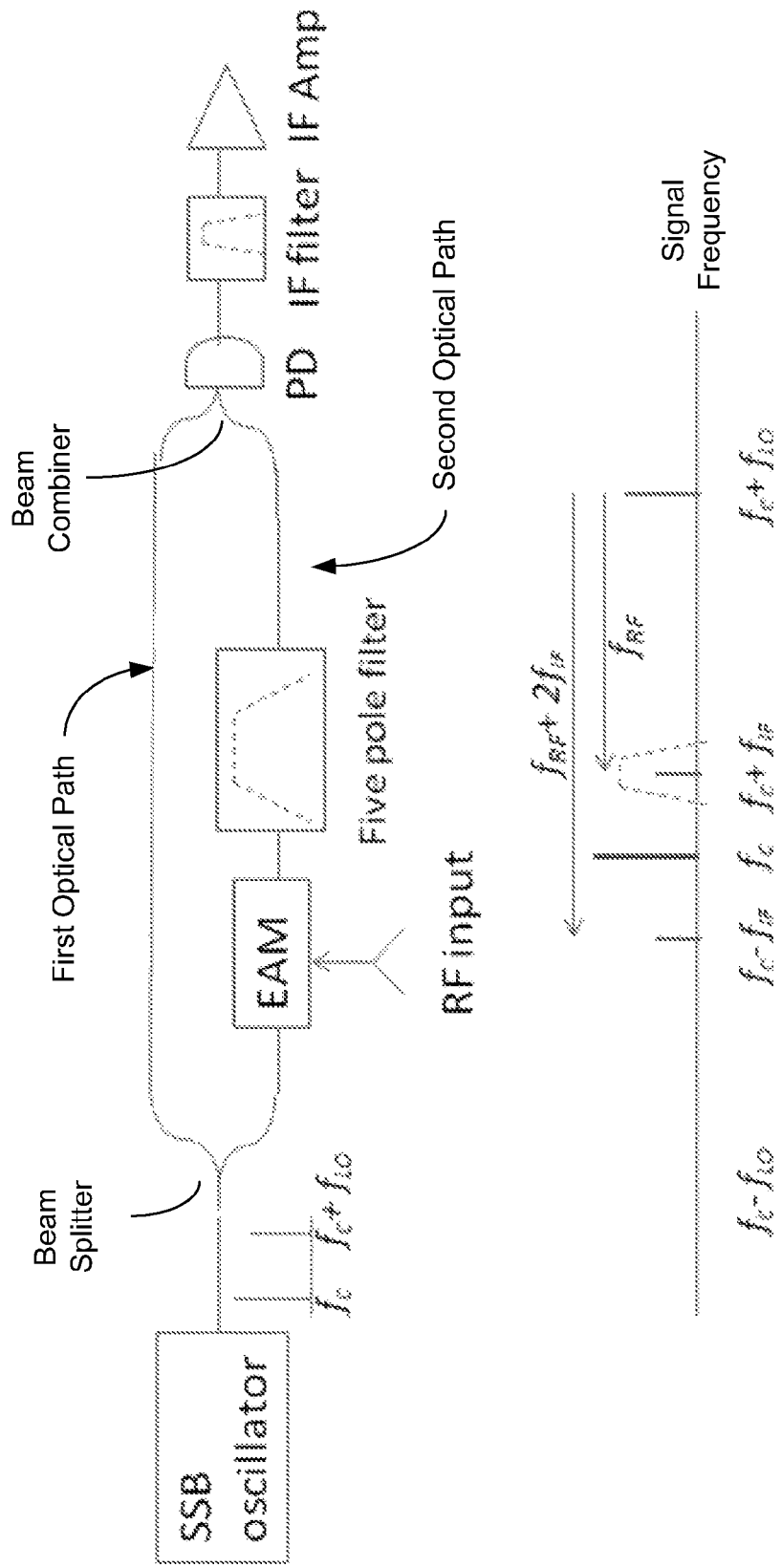
FIGS. 15-20 show examples of RF or microwave receivers.

FIG. 15 shows an example. The SSB oscillator generates a single LO optical sideband at $f_c+f_{LO}$ and does not produce LO sideband at $f_c-f_{LO}$. An optical beam splitter is provided to split the output of the SSB oscillator into two signals along first and second optical paths, respectively. The first optical path and the second optical path are combined by a beam combiner and the combined optical signal is directed to a photodetector (PD). The second optical path includes an optical modulator such as an EAM or EOM that applies the RF input to modulate the light. A narrow band optical filter, e.g., a 5-pole optical filter, is connected downstream from the optical modulator to pass only the optical signal at $f_c+f_{IF}$ and reject the image optical signal at $f_c-f_{IF}$. The image rejection ratio of the receiver is thus determined by the smaller number of the SSB sideband suppression ratio and the rejection ratio of the optical filter.

For small IF frequency, a narrowband high order optical filter is required to provide extremely high rejection of image optical signal at $f_c-f_{IF}$ and low interference from adjacent channels. However it is difficult if not completely impossible to make a high order optical filter of sub-hundred MHz bandwidth.

For relatively large IF frequency, such as 1 GHz in many radar receivers, instead of using narrowband high order optical filter, a relatively broad high order optical filter (bandwidth of 500 MHz~1 GHz) and a narrow band (as small as the signal bandwidth, e.g. a few MHz) high order microwave filter centered at IF frequency (e.g. 1 GHz in radar receiver) can be used. Compared to using a narrowband high order optical filter, the advantages are as follows. First, a relatively broad high order optical filter, e.g., a 500 MHz~1 GHz BW five pole filter, is easier to make compared to narrower 40 MHz six pole filter and narrow band high order RF filter at 1 GHz is commercially available at a low cost. Second, the narrow band RF filter can be used to eliminate out-of-band excess noise of photonic link such as RIN noise and shot noise before the IF signal is sent to the next stage of signal processing. Reduction of the noise can hence increase the sensitivity of the receiver. While a narrow band optical filter alone won't remove the broadband excess noise of photonic link coming from the carrier reinsertion. Thirdly, the pass band of the photonic receiver is determined by the IF filter when the optical filter is broader than the IF filter. Hence the receiver is insensitive to the slow drift of either the laser carrier frequency or the center frequency of the optical filter. Under this design, the image rejection will be less with the broad optical filter compared to a narrow band optical filter. However, the 70 dB image rejection can be expected with a 5 pole filter of 1 GHz BW for 1 GHz IF frequency. This performance is difficult to achieve by conventional electronic receivers. In addition, a 5 pole filter of 500 MHz BW or a 6 pole filter of 1 GHz BW can provide even higher image rejection.

Figure 16:
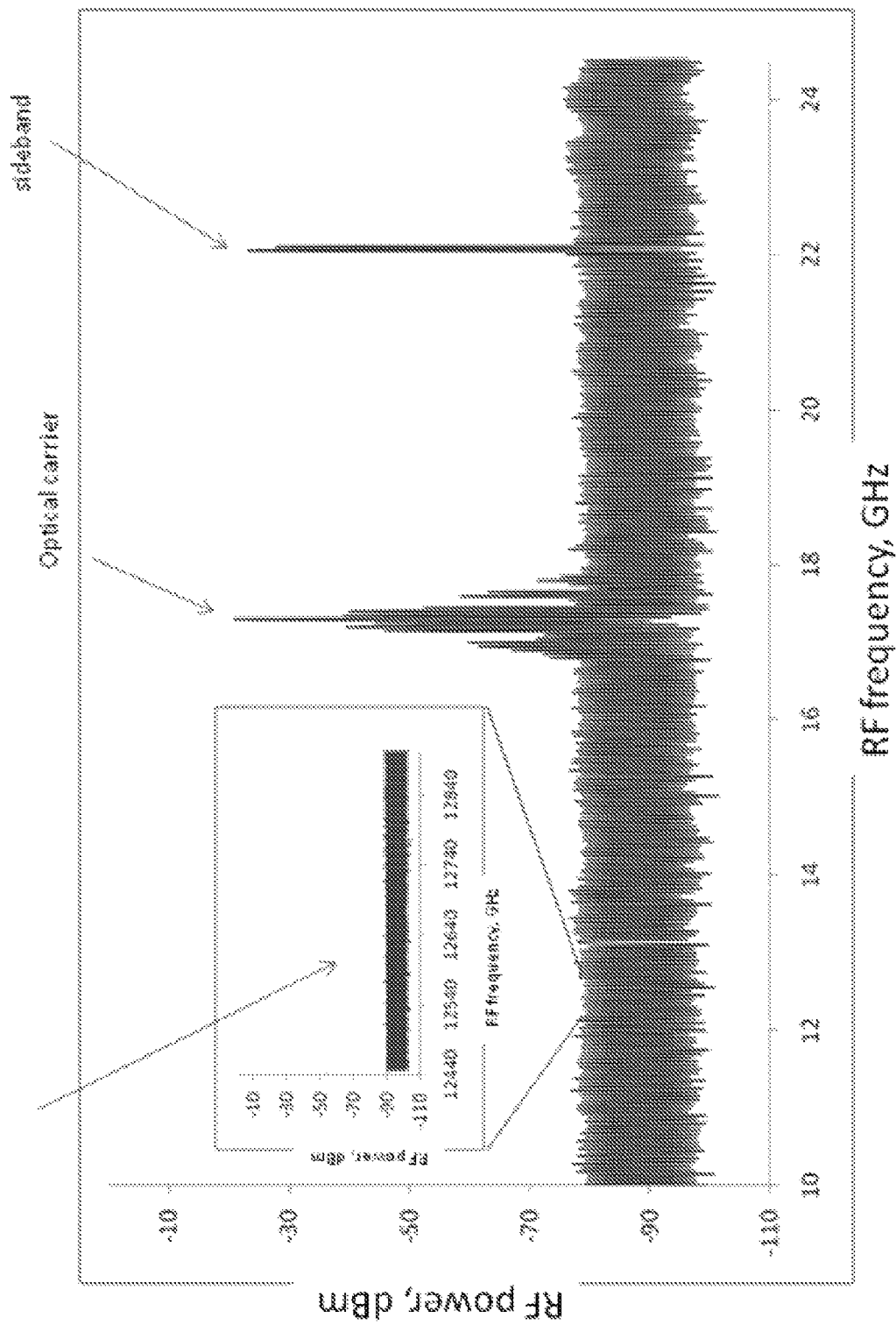
Figure 17:
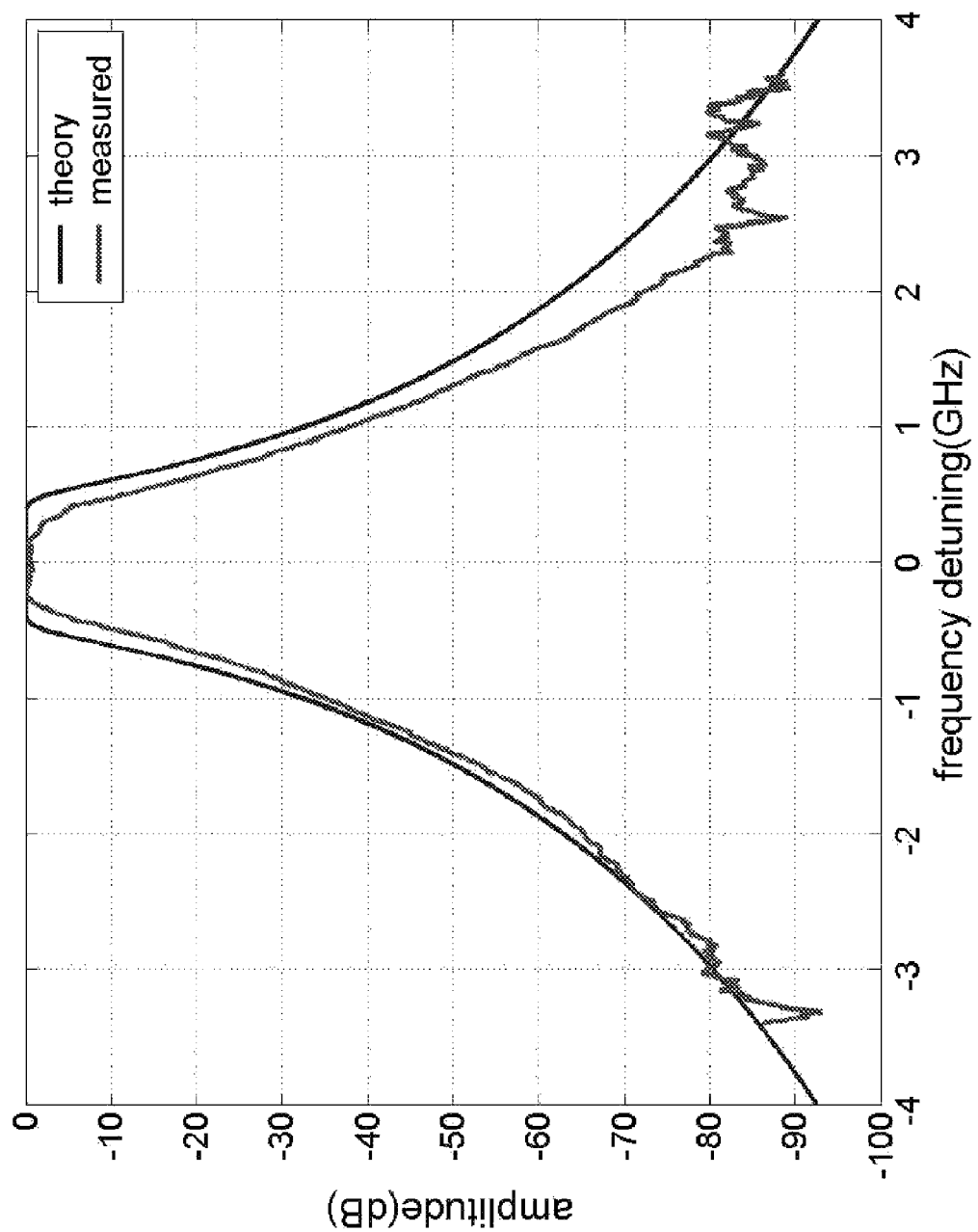

Tests were conducted by using both the SSB oscillator and a five pole optical filter based on FIG. 15. FIG. 16 shows the measurement of the sideband suppression of the SSB oscillator. The optical output of the SSB oscillator is mixed with a second laser using a fast PD to down convert the spectrum to RF domain. The RF signal is then measured with a high sensitivity RF spectrum analyzer. The side band suppression is higher than 70 dB limited by the noise floor of the spectrum analyzer. FIG. 17 shows the measured transmission of the optical five pole filter. At 2 GHz away from the center of the filter, the rejection is more than 70 dB on the right side.

Figure 18:
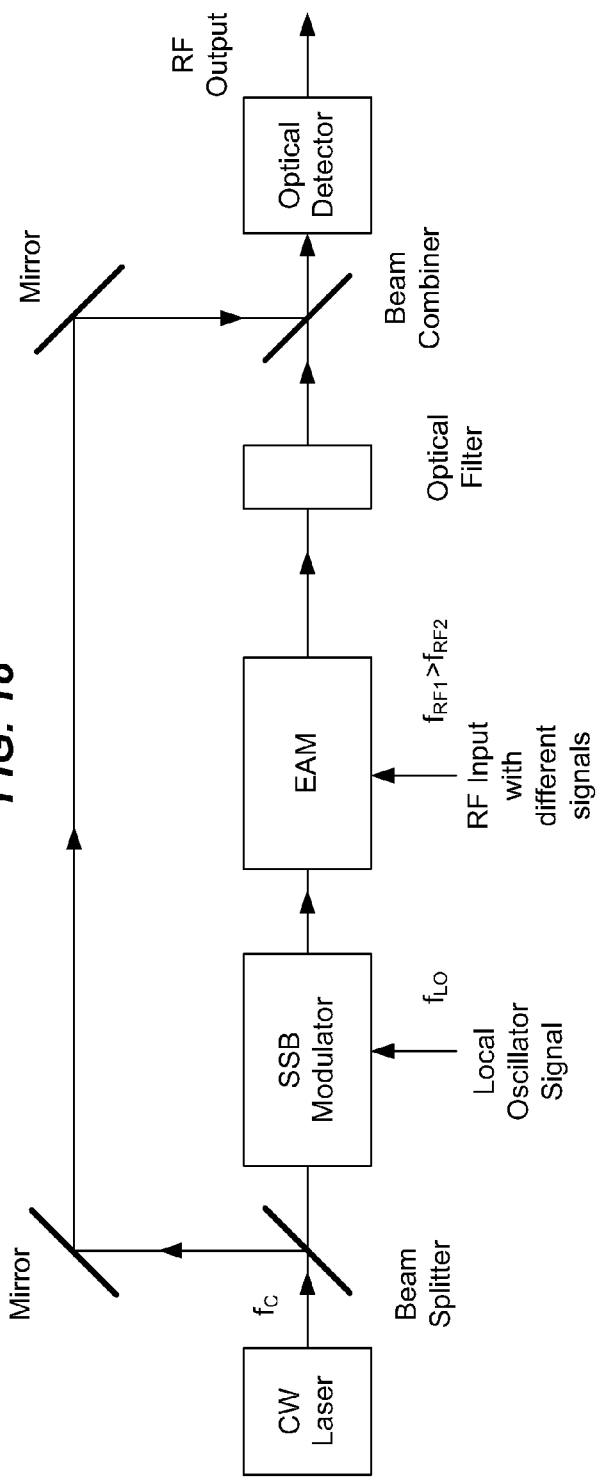

FIG. 18 shows another design where a CW laser is used to provide two optical signals along the two optical paths. In the lower optical path, a SSB modulator is provided to apply a local oscillator signal fLO to modulate the light. Another optical modulator such as an EAM or EOM is provided to modulate the light in response to the RF input signal which can include different RF signals such as two closely spaced signals at fRF1 and fRF2. An optical filter is used to filter the light form the optical modulator. The light signals in the two optical paths are combined into the optical detector to product the RF output.

Figure 19:
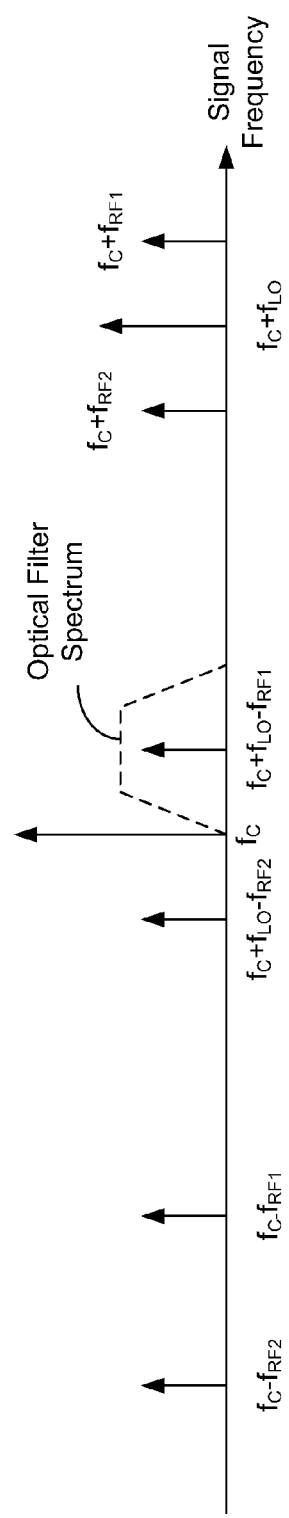

FIG. 19 illustrates the signals in the receiver in FIG. 18. In absence of the SSB modulator, the two closed spaced RF signals at fRF2 and fRF2 are difficult to separate. Under the SSB design, the two RF signals are well separated and thus the optical filter can be used to select the desired RF signal, at either fRF1 or fRF2, as the RF output.

The above examples show photonic microwave/RF receivers of very high image rejection capability based on single sideband (SSB) oscillator and high-order optical filter. The SSB oscillator can provide more than 70 dB suppression of one LO sideband limited by the measurement system. The optical filter provides more than 70 dB rejection at 2 GHz away from the center of the filter.

Figure 20:
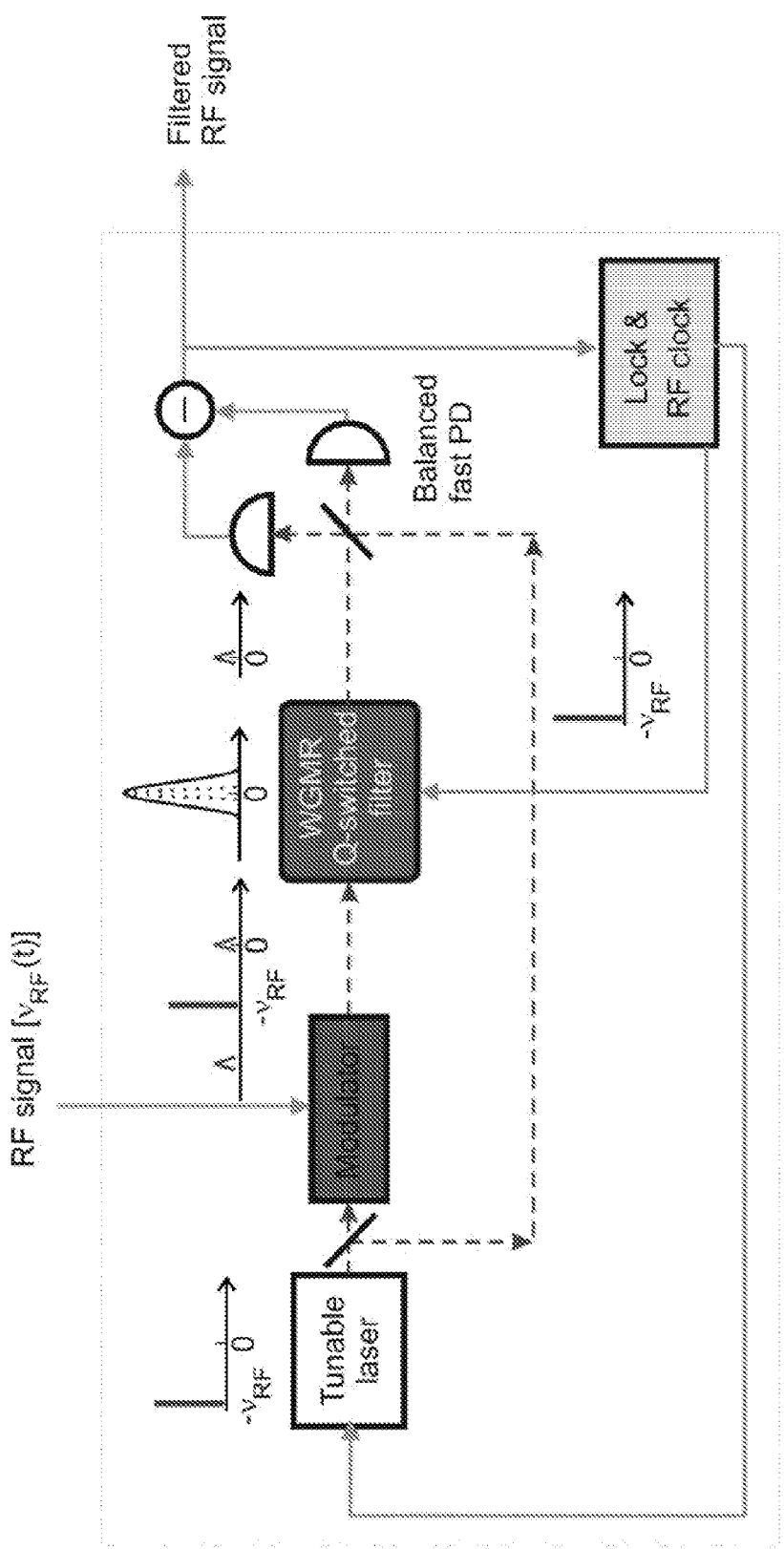

Referring to FIGS. 1A and 1B, an EO WGM resonator modulator can be electrically controlled to produce varying Q values to effectuate a WGMR Q-switched optical filter under a control an RF control signal. This filter can be used to construct a tunable RF photonic filter with selectable bandwidth (e.g., 0.1-100 MHz range) and tunable across a specified passband(e.g., 30-40 GHz). Such a filter is suitable for dynamic bandwidth allocation in space communication systems, and for detection of weak noisy SIGINT signals. The filter utilizes a high-Q single mode crystalline whispering gallery mode resonator (WGMR) that allows achieving an extremely narrow optical passband and high mode contrast at room temperature. The passband position of the filter is tuned using a compact tunable narrow-band laser (such as that based on WGMR technology). The bandwidth of the filter is adjusted by voltage tuning the spatial gap separating the WGMR and the optical coupler. The overall tuning speed does not exceed 50 microseconds FIG. 20 shows an example of this RF filter. The RF signal is upconverted to optical domain with a wideband modulator. The modulator is pumped with a laser tuned at a wavelength (frequency) such that a modulation sideband always coincides with the position of the passband of an optical filter possessing tunable bandwidth. Ultimately only one sideband passes through the filter. A part of the laser light is also sent around the modulator to beat with the filtered sideband on a fast balanced photodiode (PD) to produce the filtered RF signal. The filter operates in seeking and reception regimes. This requires scanning the laser frequency to provide information about the RF spectrum in the reception band. When the signal of interest is found, the frequency of the signal is registered and the laser and the filter are locked for this frequency. The pass band of the WGM filter is then adjusted to maximize the signal to noise ratio of the signal reception. OEwaves will build a Ka band filter with center frequency tunable across 30-40 GHz. Note that the system is fundamentally capable of operating at other bands with appropriate changes. The bandwidth will be tuned in 0.1-100 MHz frequency range. The reconfiguration will be realized in less than 50 microseconds.

The above filter can be configured to achieve one or more advantages. For example, the filter can be used to enable efficient allocation in accordance with incoming data rates and formats. The filter can be used to improve signal to noise ratio and dynamic range by selecting the optimal reception bandwidth allowing detection of signals hidden in noise background. The filter can provide dynamical routing of either a single data channel or a set of data channels leading to advanced network routing and signal processing functionalities. The filter can also be used to allow tracking data channels with changing central frequency.

While this document contains many specifics, these should not be construed as limitations on the scope of an invention or of what may be claimed, but rather as descriptions of features specific to particular embodiments of the invention. Certain features that are described in this document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

Only a few implementations are disclosed. Variations, modifications and enhancements of the disclosed implementations and other implementations can be made based on what is described and illustrated in this document.

What is claimed is:

1. A microwave or RF photonic receiver, comprising:
a single sideband modulator comprising an optical resonator made of an electro-optic crystal and structured to support optical whispering gallery modes in a first polarization mode and a second polarization mode orthogonal to the first polarization mode, both of which circulate near a rim of the optical resonator, and electrodes formed relative to the optical resonator to receive an RF or microwave signal to the optical resonator in an electric field polarization oriented relative to a crystal axis of the electro-optic crystal to effectuate coupling between an optical whispering gallery mode in the first polarization mode and another optical whispering gallery mode in the second polarization mode to produce an optical single sideband by modulation of continuous wave light at an optical carrier frequency at a sideband frequency different from the optical carrier frequency;
a frequency control mechanism coupled to the optical resonator to tune a frequency spacing between the optical single sideband and the optical carrier frequency;
an optical beam splitter that receives optical output from the single sideband modulator and splits the optical output into a first optical signal along a first optical path and a second optical signal along a second optical path;
an optical beam combiner that combines light of the first and second optical paths to produce a combined output;
an optical detector that receives the combined output;
an optical modulator in the second optical path to modulate light in response to an RF or microwave input signal; and
an optical filter downstream from the optical modulator in the second optical path to selectively transmit light at a signal band while rejecting light at other frequencies.

2. A microwave or RF photonic receiver, comprising:
a laser to produce a laser beam;
an optical beam splitter that receives laser beam from the and splits laser beam into a first optical signal along a first optical path and a second optical signal along a second optical path;
an optical beam combiner that combines light of the first and second optical paths to produce a combined output;
an optical detector that receives the combined output;
a single sideband modulator located in the second optical path and comprising an optical resonator made of an electro-optic crystal and structured to support optical whispering gallery modes in a first polarization mode and a second polarization mode orthogonal to the first polarization mode, both of which circulate near a rim of the optical resonator, and electrodes formed relative to the optical resonator to receive an RF or microwave signal to the optical resonator in an electric field polarization oriented relative to a crystal axis of the electro-optic crystal to effectuate coupling between an optical whispering gallery mode in the first polarization mode and another optical whispering gallery mode in the second polarization mode to produce an optical single sideband by modulation of continuous wave light at an optical carrier frequency at a sideband frequency different from the optical carrier frequency;
a frequency control mechanism coupled to the optical resonator to tune a frequency spacing between the optical single sideband and the optical carrier frequency;
an optical modulator in the second optical path to modulate light in response to an RF or microwave input signal; and an optical filter downstream from the optical modulator in the second optical path to selectively transmit light at a signal band while rejecting light at other frequencies.

3. The receiver as in claim 2, wherein:
the frequency control mechanism coupled to the optical resonator is configured to apply a DC bias voltage to the electro-optic crystal of the optical resonator in tuning the frequency spacing between the optical single sideband and the optical carrier frequency.

4. The receiver as in claim 2, wherein:
the frequency control mechanism coupled to the optical resonator is configured to change a temperature of the optical resonator in tuning the frequency spacing between the optical single sideband and the optical carrier frequency.

5. The receiver as in claim 2, wherein:
the frequency control mechanism coupled to the optical resonator is configured to apply a force to the electro-optic crystal of the optical resonator in tuning the frequency spacing between the optical single sideband and the optical carrier frequency.

6. The receiver as in claim 2, wherein:
the frequency control mechanism coupled to the optical resonator is configured to change an electro-optic effect of the electro-optic crystal of the optical resonator in tuning the frequency spacing between the optical single sideband and the optical carrier frequency.

7. The receiver as in claim 2, wherein:
the optical modulator includes an electro-absorption modulator (EAM) that performs modulation of light in response to the RF or microwave input signal.

8. The receiver as in claim 2, wherein:
the optical modulator includes an electro-optic modulator (EOM) that performs modulation of light in response to the RF or microwave input signal.

9. The receiver as in claim 2, wherein:
the optical filter includes a high order optical filter with multiple poles.

10. The receiver as in claim 2, further comprising:
an RF or microwave filter coupled to receive a detector output of the optical detector and to filter the received detector output for reducing out of band noise.

11. The receiver as in claim 2, further comprising:
a locking circuit that locks the laser and the single sideband modulator relative to each other to stabilize the single sideband modulator in frequency.

12. The receiver as in claim 11, wherein:
the locking circuit includes an atomic frequency reference to which the single sideband modulator is stabilized in frequency.

13. The receiver as in claim 1, wherein:
the frequency control mechanism coupled to the optical resonator is configured to apply a DC bias voltage to the electro-optic crystal of the optical resonator in tuning the frequency spacing between the optical single sideband and the optical carrier frequency.

14. The receiver as in claim 1, wherein:
the frequency control mechanism coupled to the optical resonator is configured to change a temperature of the optical resonator in tuning the frequency spacing between the optical single sideband and the optical carrier frequency.

15. The receiver as in claim 1, wherein:
the frequency control mechanism coupled to the optical resonator is configured to apply a force to the electro-optic crystal of the optical resonator in tuning the frequency spacing between the optical single sideband and the optical carrier frequency.

16. The receiver as in claim 1, wherein:
the frequency control mechanism coupled to the optical resonator is configured to change an electro-optic effect of the electro-optic crystal of the optical resonator in tuning the frequency spacing between the optical single sideband and the optical carrier frequency.

17. The receiver as in claim 1, wherein:
the optical modulator includes an electro-absorption modulator (EAM) that performs modulation of light in response to the RF or microwave input signal.

18. The receiver as in claim 1, wherein:
the optical modulator includes an electro-optic modulator (EOM) that performs modulation of light in response to the RF or microwave input signal.

19. The receiver as in claim 1, wherein:
the optical filter includes a high order optical filter with multiple poles.

20. The receiver as in claim 1, further comprising:
an RF or microwave filter coupled to receive a detector output of the optical detector and to filter the received detector output for reducing out of band noise.

21. The receiver as in claim 1, further comprising:
a laser that produces the light coupled into the optical resonator; and
a locking circuit that locks the laser and the single sideband modulator relative to each other to stabilize the single sideband modulator in frequency.

22. The receiver as in claim 21, wherein:
the locking circuit includes an atomic frequency reference to which the single sideband modulator is stabilized in frequency.

\* \* \* \* \*